US011782345B2

(12) United States Patent
Chen et al.

(10) Patent No.: US 11,782,345 B2
(45) Date of Patent: Oct. 10, 2023

(54) BOTTOM ANTIREFLECTIVE COATING MATERIALS

(71) Applicant: Taiwan Semiconductor Manufacturing Co., Ltd., Hsinchu (TW)

(72) Inventors: Chien-Chih Chen, Taipei (TW); Ching-Yu Chang, Yilang County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 826 days.

(21) Appl. No.: 16/704,169

(22) Filed: Dec. 5, 2019

(65) Prior Publication Data

US 2021/0041784 A1 Feb. 11, 2021

Related U.S. Application Data

(60) Provisional application No. 62/882,715, filed on Aug. 5, 2019.

(51) Int. Cl.
*G03F 7/038* (2006.01)
*G03F 7/039* (2006.01)
(Continued)

(52) U.S. Cl.
CPC ............ *G03F 7/091* (2013.01); *C09D 5/006* (2013.01); *C09D 165/00* (2013.01); *G03F 7/038* (2013.01);
(Continued)

(58) Field of Classification Search
None
See application file for complete search history.

(56) References Cited

U.S. PATENT DOCUMENTS

| 5,148,322 A * | 9/1992 | Aoyama | G02B 3/02 359/708 |
| 2008/0220381 A1* | 9/2008 | Hatakeyama | G03F 7/091 430/326 |

(Continued)

FOREIGN PATENT DOCUMENTS

| JP | 2003280202 A * | 10/2003 |
| JP | 2004054286 A | 2/2004 |

(Continued)

OTHER PUBLICATIONS

Zhang, Yu et al., "Photochemical conversion of tin-oxo cage compounds studied using hard x-ray photoelectron spectroscopy," Journal of Micro-Nanolithography, MEMS, and MOEMS, 16(2), Jun. 22, 2017, 8 pages.

*Primary Examiner* — Martin J Angebranndt
(74) *Attorney, Agent, or Firm* — HAYNES AND BOONE, LLP

(57) ABSTRACT

A method according to the present disclosure includes providing a substrate, depositing an underlayer over the substrate, depositing a photoresist layer over the underlayer, exposing a portion of the photoresist layer and a portion of the underlayer to a radiation source according to a pattern, baking the photoresist layer and underlayer, and developing the exposed portion of the photoresist layer to transfer the pattern to the photoresist layer. The underlayer includes a polymer backbone, a polarity switchable group, a crosslinkable group bonded to the polymer backbone, and photoacid generator. The polarity switchable group includes a first end group bonded to the polymer backbone, a second end group including fluorine, and an acid labile group bonded between the first end group and the second end group. The exposing decomposes the photoacid generator to (Continued)

generate an acidity moiety that detaches the second end group from the polymer backbone during the baking.

20 Claims, 22 Drawing Sheets

(51) Int. Cl.
G03F 7/09 (2006.01)
G03F 7/004 (2006.01)
G03F 7/20 (2006.01)
G03F 7/16 (2006.01)
G03F 7/32 (2006.01)
G03F 7/11 (2006.01)
G03F 7/38 (2006.01)
C09D 165/00 (2006.01)
C09D 5/00 (2006.01)

(52) U.S. Cl.
CPC ............ *G03F 7/039* (2013.01); *G03F 7/11* (2013.01); *G03F 7/162* (2013.01); *G03F 7/168* (2013.01); *G03F 7/2004* (2013.01); *G03F 7/2006* (2013.01); *G03F 7/322* (2013.01); *G03F 7/38* (2013.01)

(56) References Cited

U.S. PATENT DOCUMENTS

| | | |
|---|---|---|
| 2009/0098490 A1 | 4/2009 | Pham et al. |
| 2010/0136477 A1 | 6/2010 | Ng et al. |
| 2010/0213580 A1 | 8/2010 | Meador et al. |
| 2011/0076626 A1 | 3/2011 | Padmanaban et al. |
| 2012/0208125 A1* | 8/2012 | Hatakeyama ......... G03F 7/0043 430/296 |
| 2013/0084528 A1* | 4/2013 | Hatakeyama ......... G03F 7/0397 430/326 |
| 2013/0280656 A1 | 10/2013 | Lowes et al. |
| 2015/0099228 A1* | 4/2015 | Hatakeyama ......... G03F 7/0043 430/326 |
| 2016/0238933 A1* | 8/2016 | Su ........................... C09D 5/006 |
| 2016/0364749 A1 | 12/2016 | Wang et al. |
| 2017/0017158 A1 | 1/2017 | Cheng et al. |
| 2018/0088463 A1* | 3/2018 | Hatakeyama ......... G03F 7/0397 |
| 2018/0277359 A1 | 9/2018 | Liu et al. |

FOREIGN PATENT DOCUMENTS

| | | | |
|---|---|---|---|
| KR | 20120035134 A | 4/2012 | |
| TW | 20191914992 A | 4/2019 | |
| WO | WO-2012002519 A1 * | 1/2012 | ........... G03F 7/0046 |

* cited by examiner

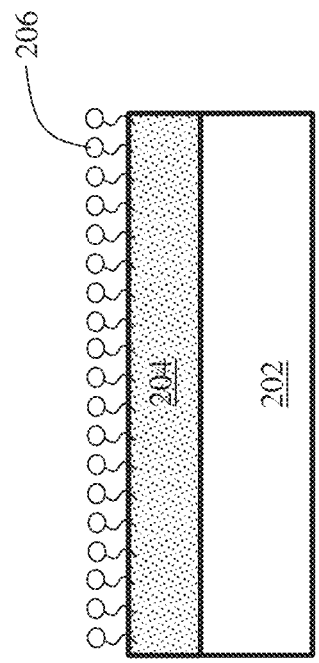
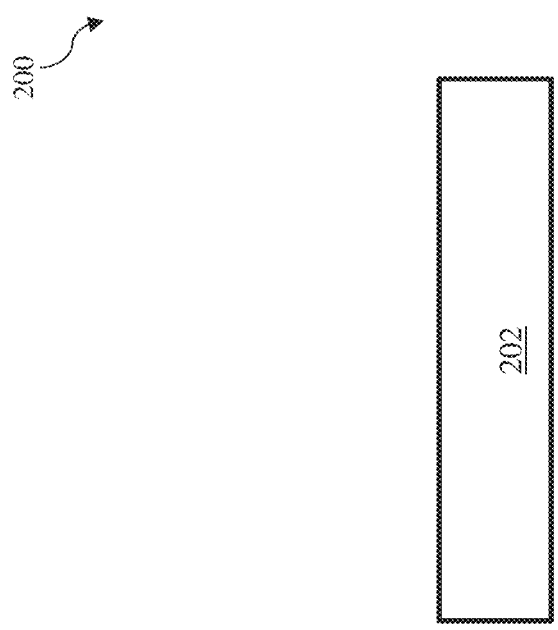

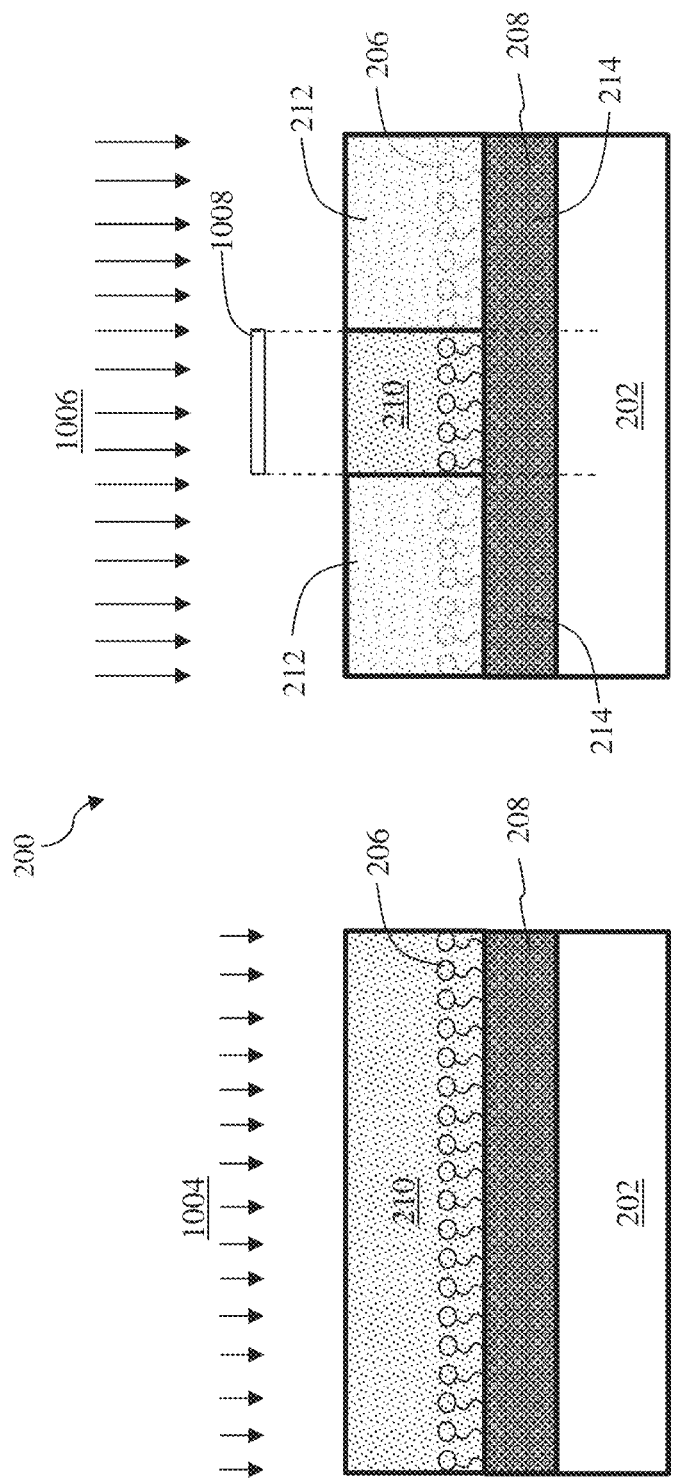

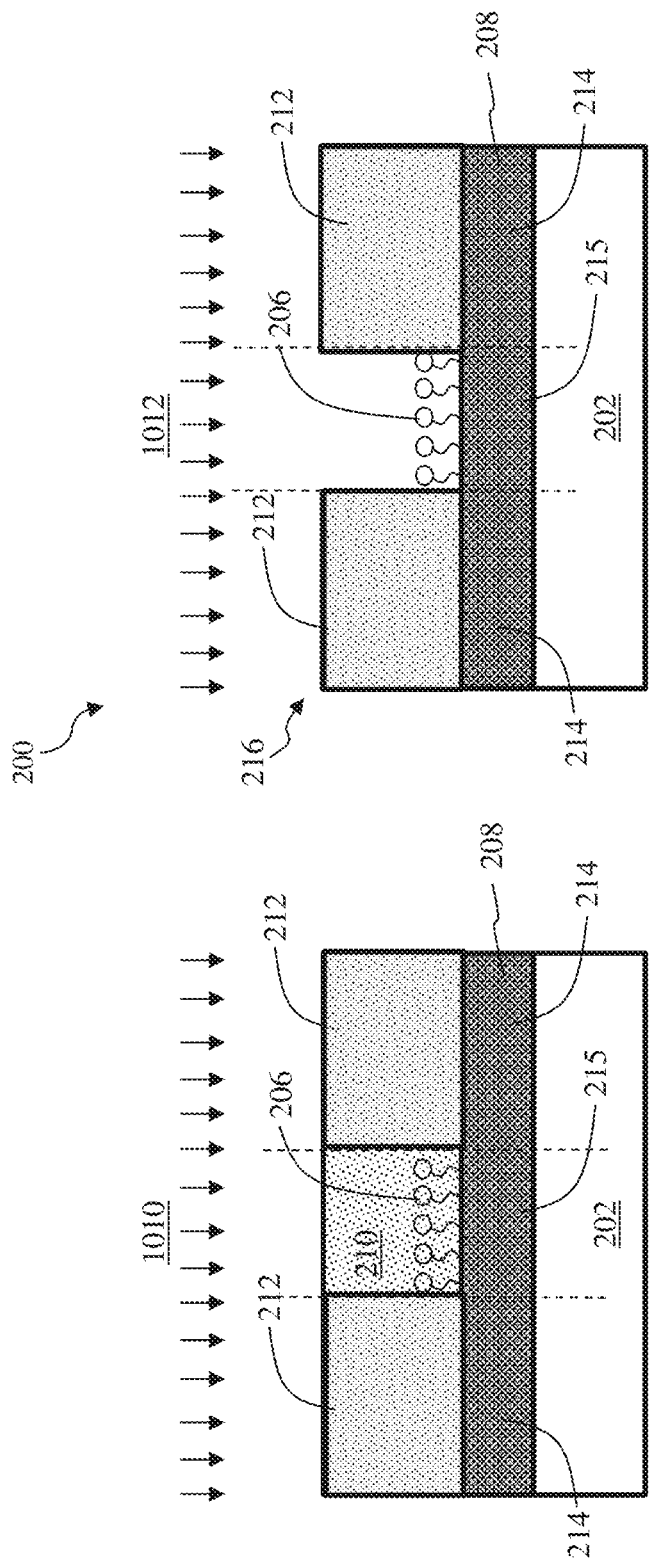

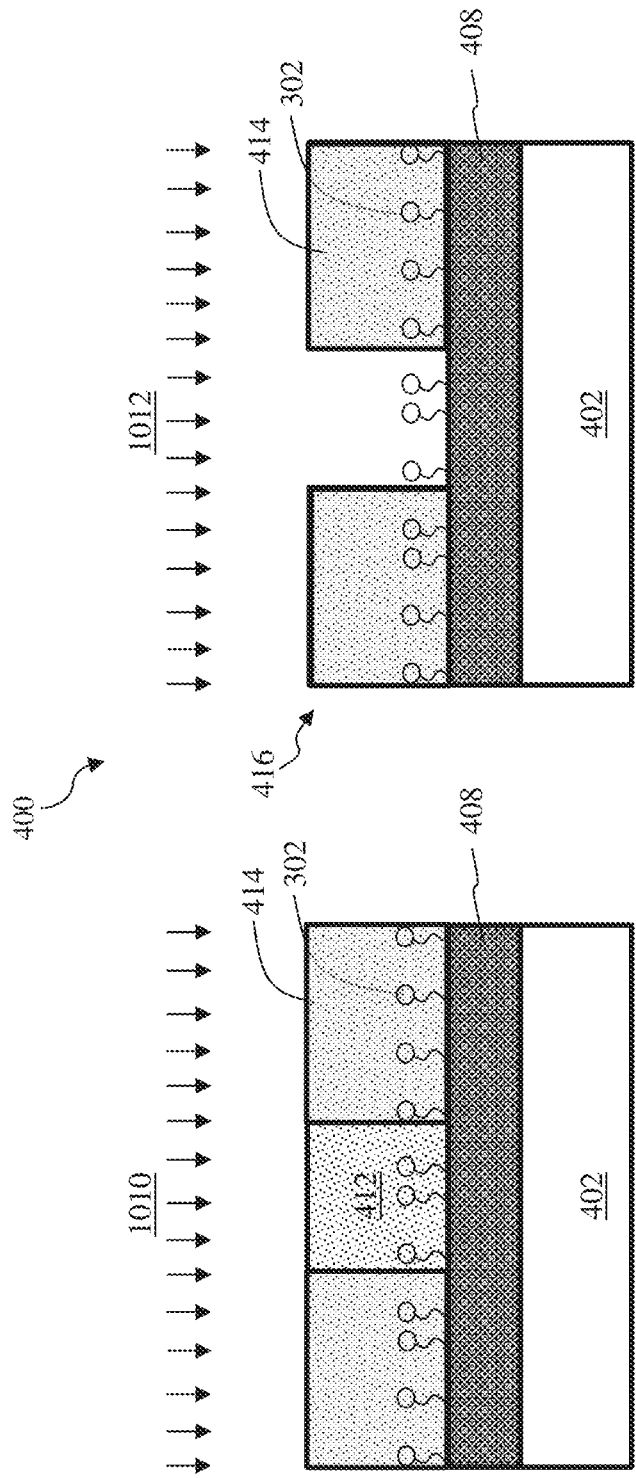

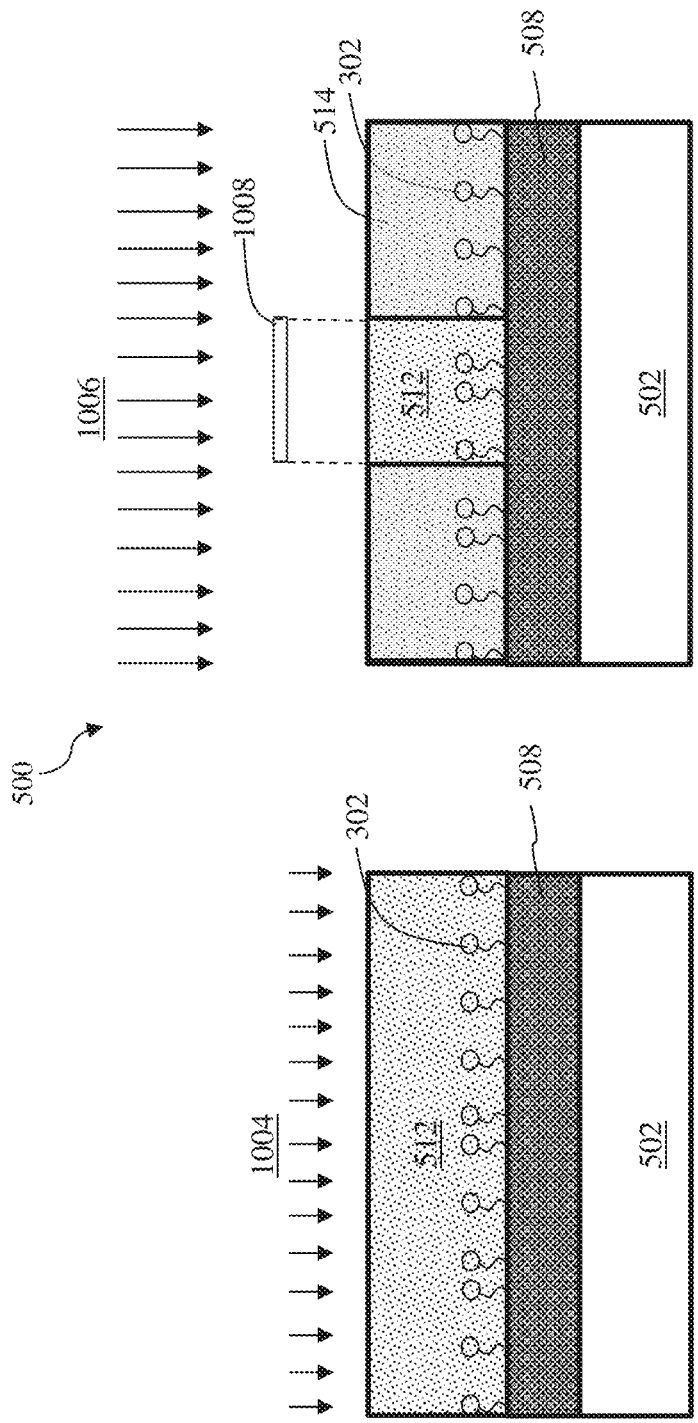

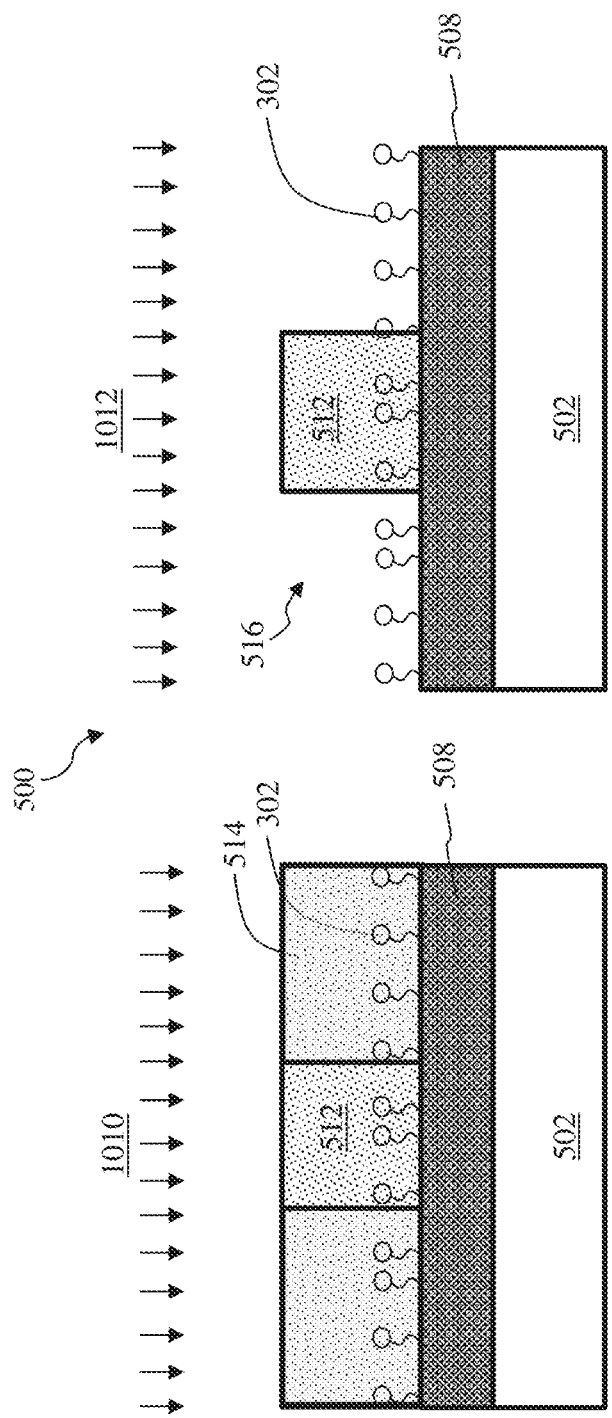

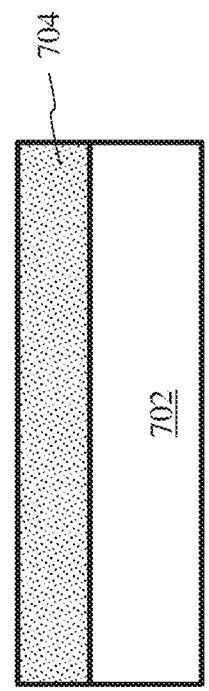
Fig. 30
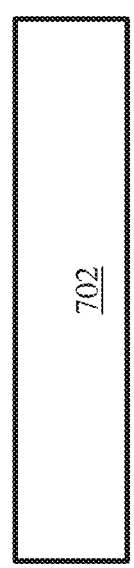
Fig. 29

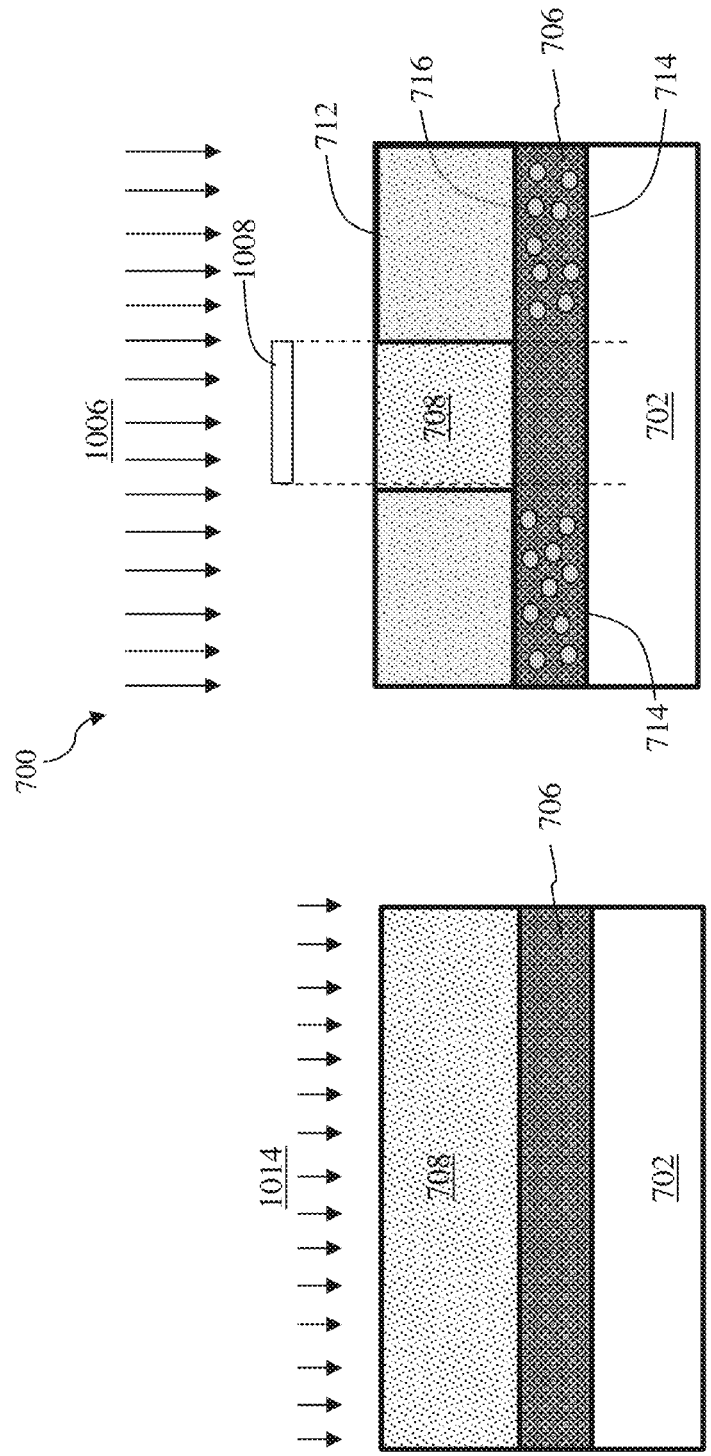

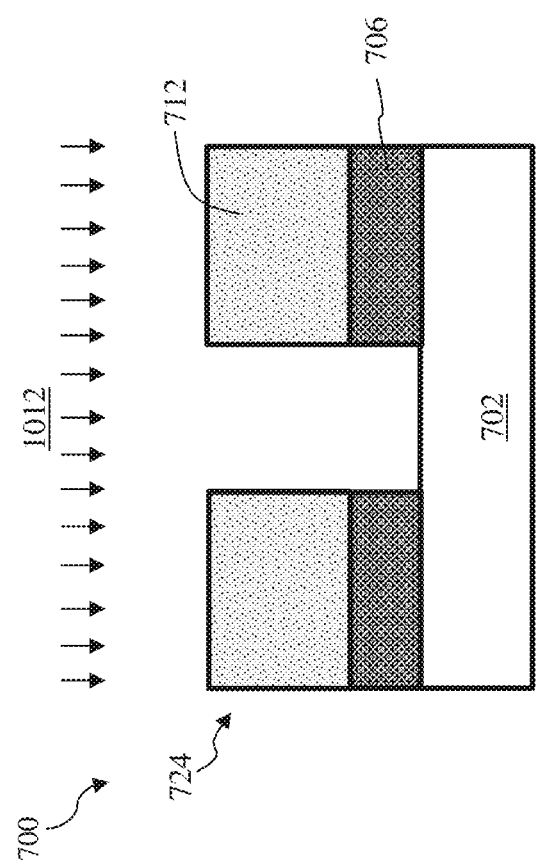

BOTTOM ANTIREFLECTIVE COATING MATERIALS

PRIORITY DATA

This application claims priority to U.S. Provisional Patent Application Ser. No. 62/882,715 filed on Aug. 5, 2019, the entire disclosure of which is hereby incorporated herein by reference.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advancements to be realized, similar developments in IC processing and manufacturing are needed.

In one exemplary aspect, photolithography is a process used in semiconductor micro-fabrication to selectively remove parts of a thin film or a substrate. The process uses light to transfer a pattern (e.g., a geometric pattern) from a photomask to a light-sensitive layer (e.g., a photoresist layer) on the substrate. The light causes a chemical change (e.g., increasing or decreasing solubility) in exposed regions of the light-sensitive layer. Bake processes may be performed before and/or after exposing the substrate, such as in a pre-exposure and/or a post-exposure bake process. The pre-exposure bake process may also be referred to as a post-application exposure process. A developing process then selectively removes the exposed or unexposed regions with a developer solution forming an exposure pattern in the substrate. Finally, a process is implemented to remove (or strip) the remaining photoresist from the underlying material layer(s), which may be subjected to addition circuit fabrication steps. For a complex IC device, a substrate may undergo multiple photolithographic patterning processes. Although conventional underlayer compositions and photolithography processes are generally adequate for their intended purposes, they have not been entirely satisfactory. For example, in some IC fabrication scenarios, a photoresist layer may be deposited directly on an underlayer, such as a bottom antireflective coating (BARC) layer, to pattern a material layer below the underlayer. Due to the photoresist layer's affinity to the underlayer, scums or leftover photoresist material may remain among the exposure pattern on the underlayer. Additional improvements are desirable.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 3-10 are fragmentary cross-sectional views of a workpiece at intermediate steps of the method in FIG. 1 and using the first coating solution in FIG. 2, according to various aspects of the present disclosure.

FIGS. 12-27 are fragmentary cross-sectional views of a workpiece at intermediate steps of the method in FIG. 1 and using the second coating solution in FIG. 11, according to various aspects of the present disclosure.

FIGS. 29-37 are fragmentary cross-sectional views of a workpiece at intermediate steps of the method in FIG. 1 and using the third coating solution in FIG. 28, according to various aspects of the present disclosure.

DETAILED DESCRIPTION

Figure 1:
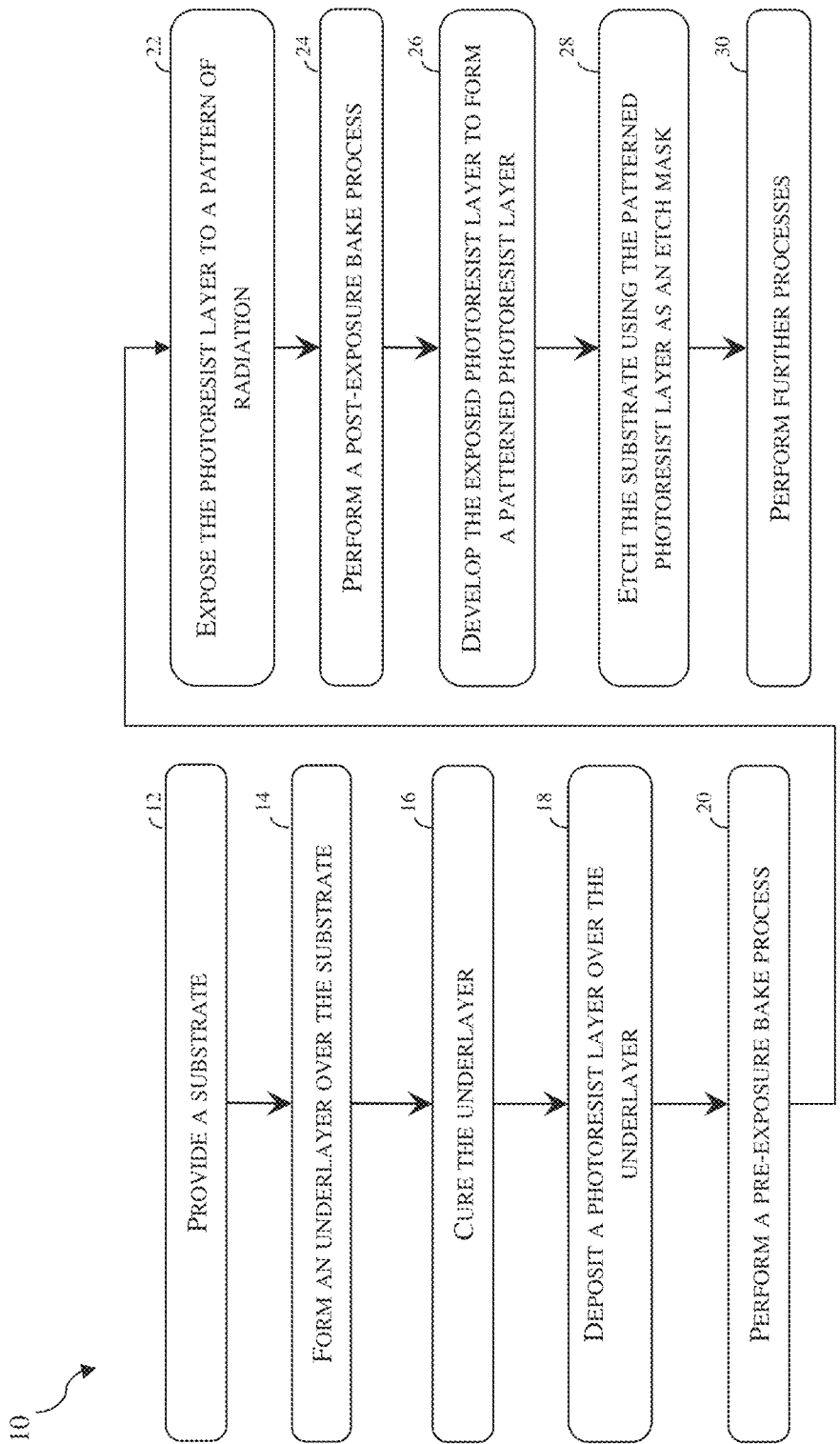
FIG. 1 illustrates a flowchart of a method of semiconductor device fabrication according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. Still further, when a number or a range of numbers is described with "about,"

"approximate," and the like, the term is intended to encompass numbers that are within +/−10% of the number described, unless otherwise specified. For example, the term "about 5 nm" encompasses the dimension range from 4.5 nm to 5.5 nm.

The present disclosure relates generally to semiconductor device fabrication and, more particularly, to compositions of an underlayer and photolithography processes to reduce scums. In some semiconductor fabrication scenarios, a photoresist layer is directly deposited on an underlayer, such as a bottom antireflective coating (BARC) layer, which is deposited on a material layer. Photolithography processes are then applied to pattern the photoresist layer to form a patterned photoresist layer. The material layer is then etched using the patterned photoresist layer as an etch mask to form a patterned material layer. The patterned material layer is subsequently used as an etch mask to etch and pattern the layers beneath the material layer to form various semiconductor device features and contact structures. For instance, when extreme ultraviolet (EUV) is used as the radiation source for lithography, an organometallic photoresist that absorbs EUV may be used. The organometallic photoresist may include a metal, such as tin, palladium, zirconium, cobalt, nickel, chromium, iron, rhodium, and ruthenium. An example of an organometallic photoresist is a tin-oxo cage compound (SnOx). To introduce distinctive etch selectivity, the material layer to be patterned using the patterned organometallic photoresist layer may be a carbon-containing layer, such as a spin-on carbon (SOC) layer. The underlayer is disposed between the material layer and the organometallic photoresist layer may have a thickness between about 3 nm and 30 nm. In some instances, the underlayer may be a bottom antireflective coating (BARC) layer that improves adhesion of the organometallic photoresist and/or reduces reflection of the radiation off of a bottom interface of the organometallic photoresist layer. While some of the embodiments of the present disclosure will be described below in conjunction with organometallic photoresist layers, a person of ordinary skill in the art would appreciate that these embodiments may as well be implemented when other types of photoresist layers are used, as long as these types of photoresist layers are deposited directly on the underlayer.

The present disclosure discloses coating solutions for depositing of an underlayer that reduce scum formation as well as methods of depositing an underlayer using the disclosed coating solutions. In some embodiments, a first underlayer formed using a first coating solution includes a fluorine-containing group that may be cleaved off after being exposed to a radiation source. Because the fluorine-containing group reduces the affinity between the photoresist layer and the first underlayer, less residual photoresist material or scum may remain on the first underlayer after the exposed photoresist layer is developed. In some other embodiments, a second underlayer formed using a second coating solution includes a permanently bonded fluorine-containing group. Because the fluorine-containing group reduces the affinity between the photoresist layer and the second underlayer, less residual photoresist material or scum may remain after the exposed photoresist layer is developed. In still some other embodiments, a third underlayer formed using a third coating solution includes a photobase generator and a thermal acid generator. Because unexposed third underlayer may be selectively removed along with the unexposed photoresist in a negative tone development (NTD) process, less residual photoresist material or scum may remain after the exposed photoresist layer is developed. By reducing the amount of leftover photoresist/scum, embodiments of the present disclosure enlarge process windows and improve yield.

Figure 2A:
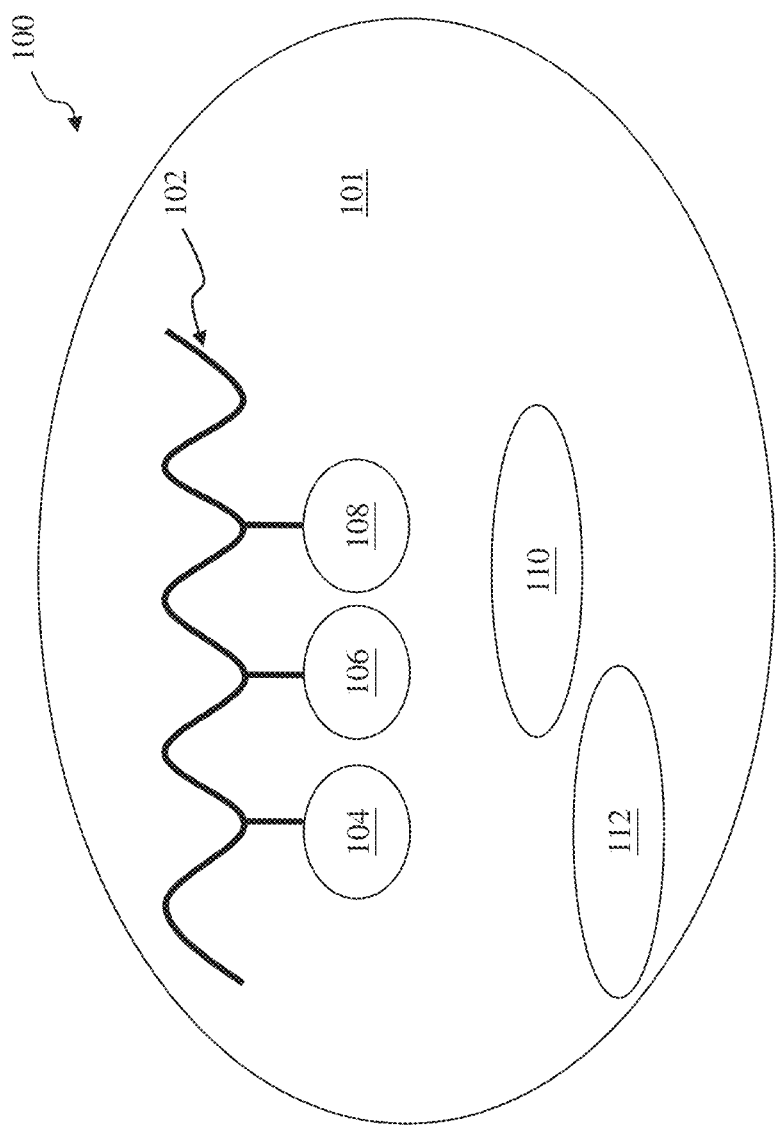
FIG. 2A illustrates constituents of a first coating solution to form an underlayer, according to various aspects of the present disclosure.
Figure 2B:
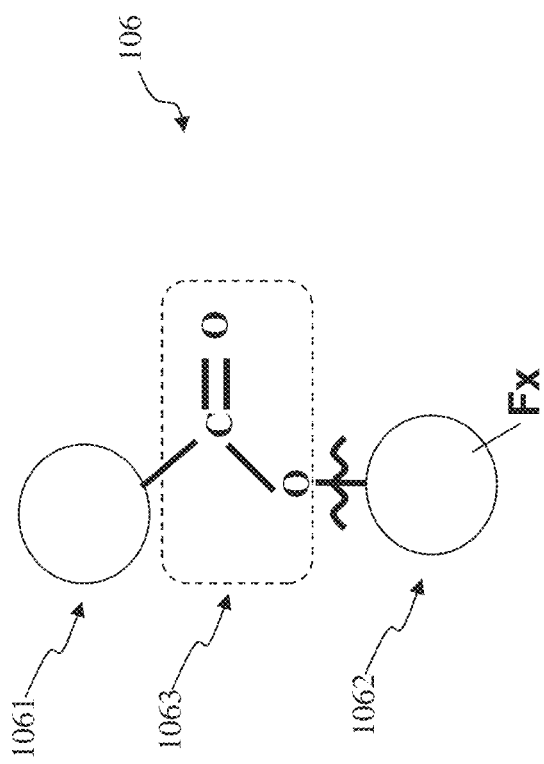
FIG. 2B illustrates a polarity switchable group in the first coating solution, according to various aspects of the present disclosure.
Figure 11:
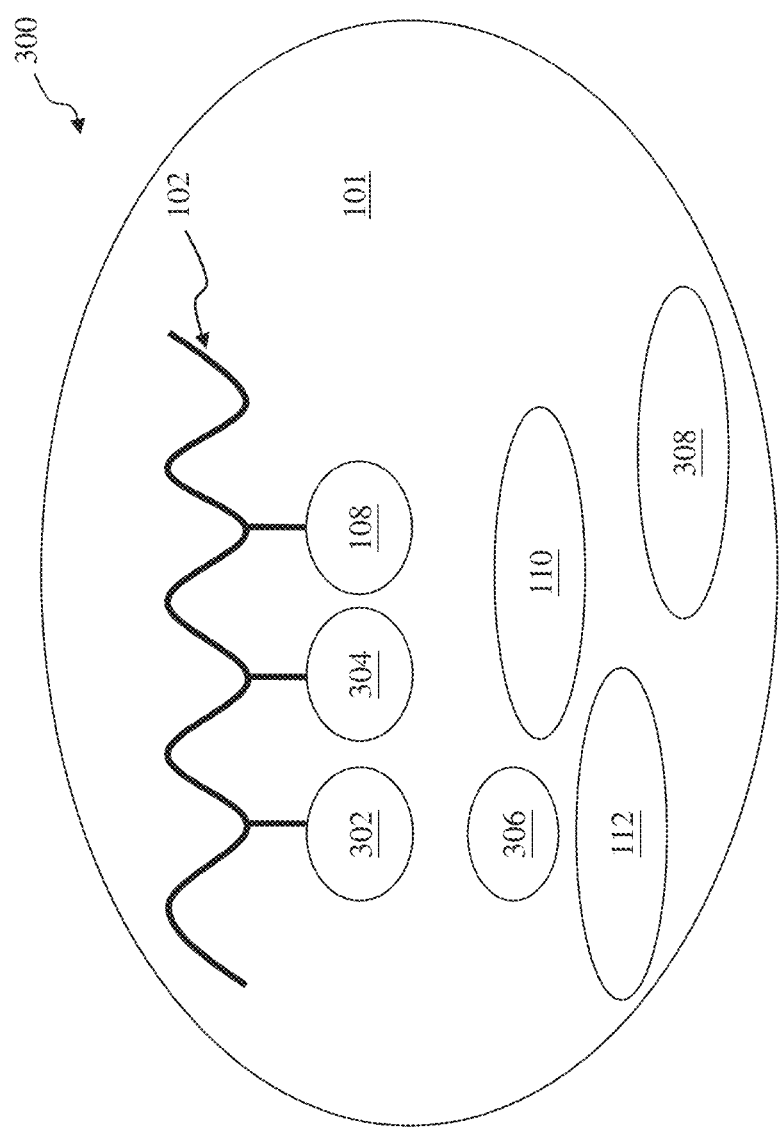
FIG. 11 illustrates constituents of a second coating solution to form an underlayer, according to various aspects of the present disclosure.
Figure 28:
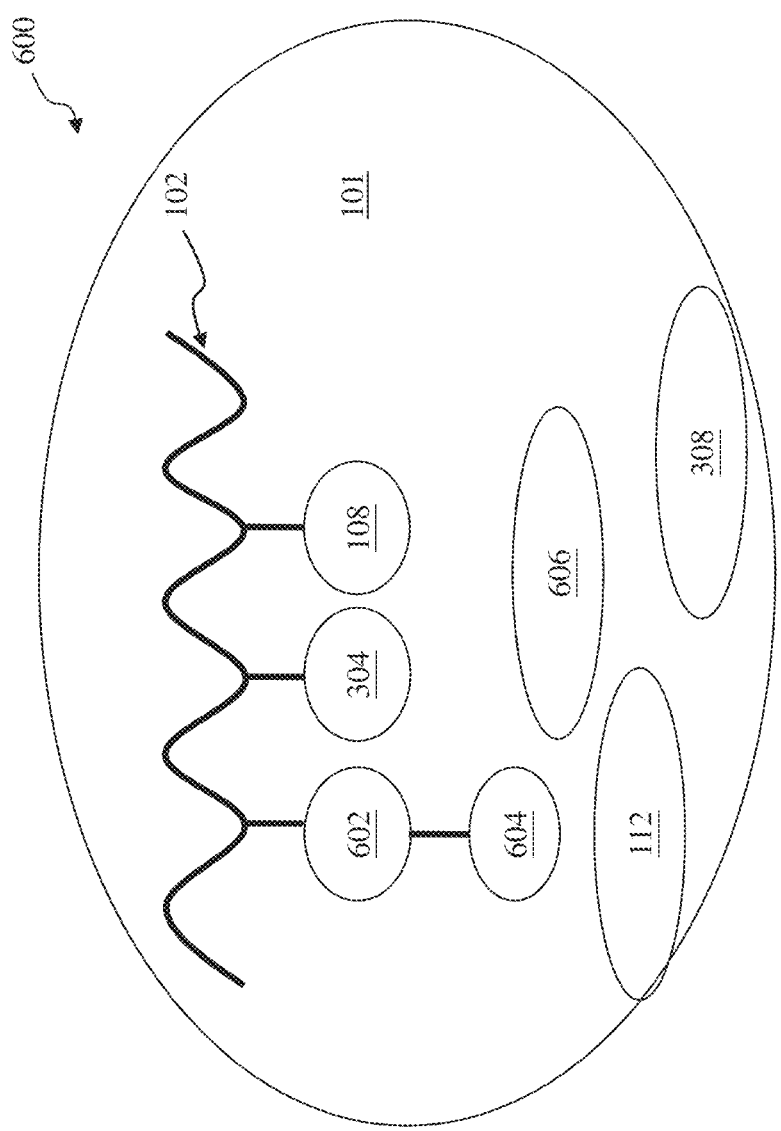
FIG. 28 illustrates constituents of a third coating solution to form an underlayer, according to various aspects of the present disclosure.

FIG. 1 illustrate a flowchart of a method 10 for fabricating a semiconductor device on a workpiece. The method 10 is merely an example and is not intended to limit the present disclosure beyond what is explicitly recited in the claims. Additional operations can be provided before, during, and after the method 10, and some operations described can be replaced, eliminated, or moved around for additional embodiments of the process. Operations of the method 10 will be described below with reference to cross-sectional views of a workpiece 200 as shown in FIGS. 3-10 when a first coating solution 100 having constituents shown in FIGS. 2A and 2B is used to form a first underlayer. Operations of the method 10 will be described below with reference to cross-sectional views of a workpiece 400 or a workpiece 500 as shown in FIGS. 12-27 when a second coating solution 300 having constituents shown in FIG. 11 is used to form a second underlayer. Operations of the method 10 will be described below with reference to cross-sectional views of a workpiece 700 as shown in FIGS. 29-37 when a third coating solution 600 having constituents shown in FIG. 28 is used to form a third underlayer.

Referring to FIGS. 1 and 3, method 10 includes a block 12 where a substrate 202 is received. In some embodiments, the substrate 202 may include an elementary (single element) semiconductor, such as silicon and/or germanium; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof. In some other embodiments, the substrate 202 may be a single-layer material having a uniform composition; alternatively, the substrate 202 may include multiple material layers having similar or different compositions suitable for IC device manufacturing. In one example, the substrate 202 may be a silicon-on-insulator (SOI) substrate having a semiconductor silicon layer formed on a silicon oxide layer. In other example, the substrate 202 may include a conductive layer, a semiconductor layer, a dielectric layer, other layers, and/or combinations thereof. The substrate 202 may include various circuit features formed thereon including, for example, field effect transistors (FETs), metal-oxide semiconductor field effect transistors (MOSFETs), CMOS transistors, high voltage transistors, high frequency transistors, bipolar junction transistors, diodes, resistors, capacitors, inductors, varactors, other suitable devices, and/or combinations thereof. In some embodiments where the substrate 202 includes FETs, various doped regions, such as source/drain regions, are formed on the substrate 202. The doped regions may be doped with p-type dopants, such as phosphorus or arsenic, and/or n-type dopants, such as boron or $BF_2$, depending on design requirements. The doped regions may be planar or non-planar (e.g., in a fin-like FET device) and may be formed directly on the substrate 202, in a P-well structure, in an N-well structure, in a dual-well structure, or using a raised structure. Doped regions may be formed by implantation of dopant atoms, in-situ doped epitaxial growth, and/or other suitable techniques.

While not shown in FIG. 26, the substrate 202 may include a material layer such that the material layer constitutes the topmost layer of the substrate 202. The composition of the material layer may be selected such that the material layer may be etched without substantially etching a patterned photoresist layer. That way, the material layer may be selectively etched using a patterned photoresist layer as an etch mask. In embodiments where the photoresist layer deposited over the material layer is an organometallic photoresist layer that includes a metal, the material layer may include carbon. In some instances, the material layer may be a spin-on-carbon (SOC) layer. In some implementations, the substrate 202 may further include a spin-on glass (SOG) layer that includes silicon oxide and the material layer is deposited on the SOG layer.

Referring to FIGS. 1, 2A, 2B, and 4, method 10 includes a block 14 where a first underlayer 204 is formed over the substrate 202. In some embodiments, the first underlayer 204 may be a bottom antireflective coating (BARC) layer spin-coated on the substrate 202 using a first coating solution 100 schematically shown in FIG. 2A. The first coating solution 100 includes a solvent 101, a polymeric backbone 102, a crosslinkable group 104, a polarity switchable group 106, a photoresist affinity group 108, a photoacid generator 110, and an additive 112. In some embodiments represented in FIG. 2A, the crosslinkable group 104, the polarity switchable group 106 and the photoresist affinity group 108 are each chemically bonded to the polymeric backbone 102. In some implementations, the polarity switchable group 106 and the photoresist affinity group 108 are each covalently bonded to the polymeric backbone 102. The solvent 101 may be an organic solvent and may include alkanes, alkenes, alcohols, ketones, ethers, esters, imines, amides, dimethylformamide (DMF), sulfones, sulfoxides, dimethyl sulfoxide (DMSO), cyanides, acetonitrile, dichloromethane, propylene glycol methyl ether (PGME), benzene, amines, n-butyl acetate, 2-heptanone, cyclohexanone, dichloromethane, toluene, propylene glycol methyl ether acetate (PGMEA), methyl ethyl ketone (MEK), diethyl phthalate, formic acid, or a mixture thereof.

The polymeric backbone 102 may include polystyrene (PS), poly(hydroxy styrene) (PHS), poly(methyl methacrylate) (PMMA), poly (methacrylate) (PMA), poly(norbornene)-co-maleic anhydride (COMA), or other suitable polymer, or a block copolymer thereof. In some embodiments, the crosslinkable group 104 may be an ultraviolet (UV) curable group or a thermal cross-linkable group. With respect to the former, exposure to UV may generate one or more radicals on the UV curable group, allowing it to bond to another UV curable group or another polymeric backbone other than the polymeric backbone 102 through radical polymerization reaction. With respect to the latter, exposure to a raised temperature in a bake process may cause the thermal cross-linkable group to bond to another cross-linkable group or another polymeric backbone 102 through condensation polymerization reaction. In some implementations, the crosslinkable group 104 may include a non-cyclic structure or a cyclic alkyl structure that includes 2 to 30 carbon atoms. In embodiments where the crosslinkable group 104 is a thermal cross-linkable group, the crosslinkable group 104 may include a functional group such as an halide group (—I, —Br, —Cl), an amine group (—NH2), a carboxylic acid group (—COOH), a hydroxyl group (—OH), a thiol group (—SH), a nitride (—N3) group, an epoxy group, an alkyne group, an alkene group, a ketone group, aldehyde, an ester group, acyl halide, an NHS ester group, an imidoester group, a pentafluorophenyl ester group, hydroxymethyl phosphine, carbodiimide, maleimide, a haloacetyl group, a pyridyldisulfide group, thiosulfonate, vinylsulfone, hydrazide, alkoxyamine, diazirine, aryl azide, isocyanate, phosphine, amide, ether, or a combination thereof. In embodiments where the crosslinkable group 104 is a UV curable group, the crosslinkable group 104 includes at least one light-sensitive functional group such as epoxy, azo compounds, alkyl halide, imine, alkene, alkyne, peroxide, ketone, aldehyde, allene, aromatic groups or heterocyclic groups. The aromatic structures can be phenyl, napthlenyl, phenanthrenyl, anthracenyl, phenalenyl, and other aromatic derivatives containing three to ten-membered rings.

A more detailed illustration of the polarity switchable group 106 in FIG. 2A is provided in FIG. 2B. The polarity switchable group 106 may include a first end group 1061 bonded to the polymeric backbone 102, a second end group 1062, and an acid labile group 1063 bonded to both the first end group 1061 and the second end group 1062. In some instance, the second end group 1062 has a hydrophobicity or chemical affinity (i.e. polarity) different from the the polymeric backbone 102 and groups bonded thereto. When the acid labile group 1063 is decomposed in the presence of an acid moiety, the second end group 1062 may be released, thereby changing the "polarity" of the polymeric backbone 102 and groups bonded thereto. In some implementations, the first end group 1061 may be omitted and the acid labile group 1063 is bonded to and situated between the polymeric backbone 102 and the second end group 1062, allowing the second end group 1062 to be cleaved off from the polymeric backbone 102 in the presence of acid. While the acid labile group 1063 in FIG. 2B is shown to include a carboxyl bond as an example, it may include a hydrazone bond, a carboxylic hydrazone bond, a ketal bond, an acetal bond, a siloxane bond, an aconityl bond, an oxime bond, a silyl ether bond, or an anhydride, in other implementations. The second end group 1062 includes fluorine atoms or a fluorine-containing group (Fx), such a fluorocarbon groups. As the fluorine-containing group reduces the affinity to a photoresist layer to be deposited on the first underlayer 204, whether the second end group 1062 is severed from the polymeric backbone 102 has a pivotal effect on the affinity of the first underlayer 204 to the photoresist layer. In some embodiments, the polarity switchable group 106 may include an ester, amide, imine, acetals, ketal, anhydride, sulfonic ester, t-Butyl, tert-Butoxycarbonyl, iso-Norbornyl, 2-Methyl-2-adamantyl, 2-Ethyl-2-adamantyl, 3-THF, Lactone, 2-THF, 2-THP group. In some implementations, the polarity switchable group 106 may include a functionalized group such as —I, —Br, —Cl, —COOH, —OH, —SH, —N3, —S(=O)—, alkene, alkyne, acetic acid, cyanide, or allene. To illustrate and emphasize the function of the fluorine-containing group on the polarity switchable group 106 in the first underlayer 204, the fluorine-containing group is labeled with reference numeral 206 in FIG. 4, as well as in FIGS. 5-10.

In some implementations, the polarity switchable group 106 may be obtained by chemically modifying an acid labile group. The chemical modification includes attaching a fluorine-containing group (Fx) to an acid labile group such that the fluorine-containing group and the polymeric backbone are on different sides of the acid labile bond, which is to be severed in the presence of an acid moiety. It is noted that the fluorine-containing group may not be bonded to sites adjacent to the acid labile bond to avoid impacting the acid lability of the acid labile bond. Examples of modified acid labile groups may include:

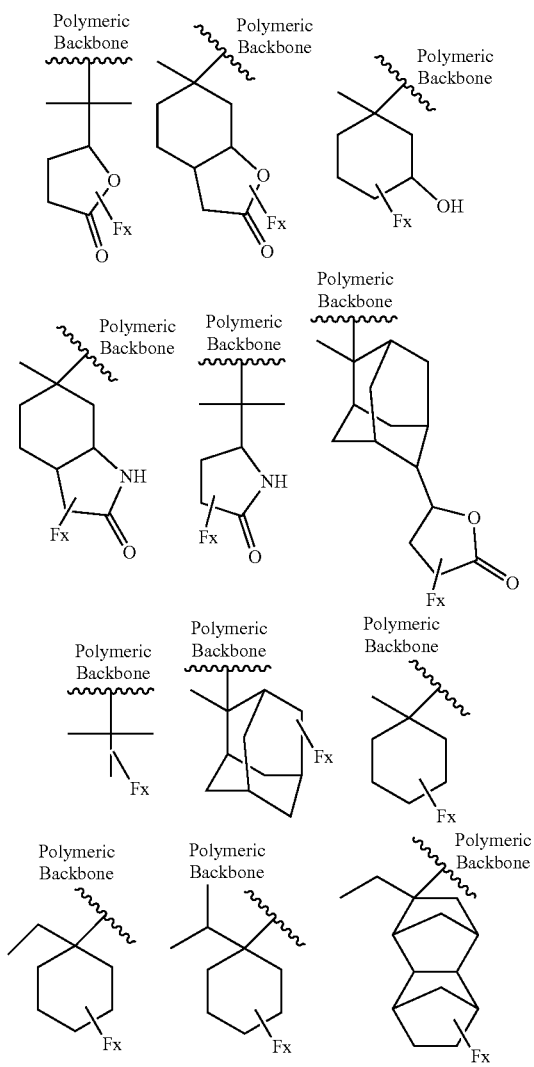

The photoresist affinity group 108 on the polymeric backbone 102 helps modulate the contact angle of the photoresist layer to be deposited on the first underlayer 204. The contact angle of the photoresist layer with respect to a surface of the first underlayer 204 depends on the photoresist layer's affinity to the first underlayer 204. As described above, the presence of the fluorine-containing group on the second end group 1062 reduces the affinity between the first underlayer 204 and the photoresist layer. In some embodiments, the photoresist affinity group 108 provides a counterbalance against the fluorine-containing group. That is, the photoresist affinity group 108 is designed to enhance affinity to the photoresist layer. In some instances, the photoresist affinity group 108 may have a cyclic or non-cyclic alkyl group having between 1 and 30 carbon atoms. To enhance affinity to the photoresist layer, the photoresist affinity group 108 may include a functionalized group such as —I, —Br, —Cl, —NH2, —COOH, —OH, —SH, —N3, —S(=O)—, alkene, alkyne, imine, ether, ester, aldehyde, ketone, amide, sulfone, acetic acid, or cyanide.

The photoacid generator 110 includes one or more chemical compounds that may decompose upon exposure to the radiation source at block 22 to produce one or more acidic moieties to cleave the acid labile group 1063 and sever the second end group 1062 from the polymeric backbone 102. In some embodiments, the photoacid generator 110 may include a phenyl ring. In some embodiments, the photoacid generator 110 includes triazines, onium salts, diazonium salts, aromatic diazonium salts, phosphonium salts, sulfonium salts, iodonium salts, imide sulfonate, oxime sulfonate, diazodisulfone, disulfone, o-nitrobenzylsulfonate, sulfonated esters, halogenerated sulfonyloxy dicarboximides, diazodisulfones, α-cyanooxyamine-sulfonates, imidesulfonates, ketodiazosulfones, sulfonyldiazoesters, 1,2-di(arylsulfonyl)hydrazines, nitrobenzyl esters, or another applicable material. The additives 112 may include surfactants that facilitate homogeneous dispersion of the constituents of the first coating solution. In some embodiments, the additives may include more than one species of surfactants to satisfactorily disperse constituents of various molecular weights. Examples of the such surfactants include polyoxyethylene lauryl ether, polyoxyethylene stearyl ether, polyoxyethylene cetyl ether, polyoxyethylene oleyl ether, polyoxyethylene octyl phenol ether, polyoxyethylene nonyl phenol ether, sorbitan monolaurate, sorbitan monopalmitate, sorbitan monostearate, sorbitan monooleate, sorbitan trioleate, sorbitan tristearate, polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants, polyethylene glycol, polypropylene glycol, polyoxyethylene cetyl ether, combinations of these, or the like.

Figure 5:
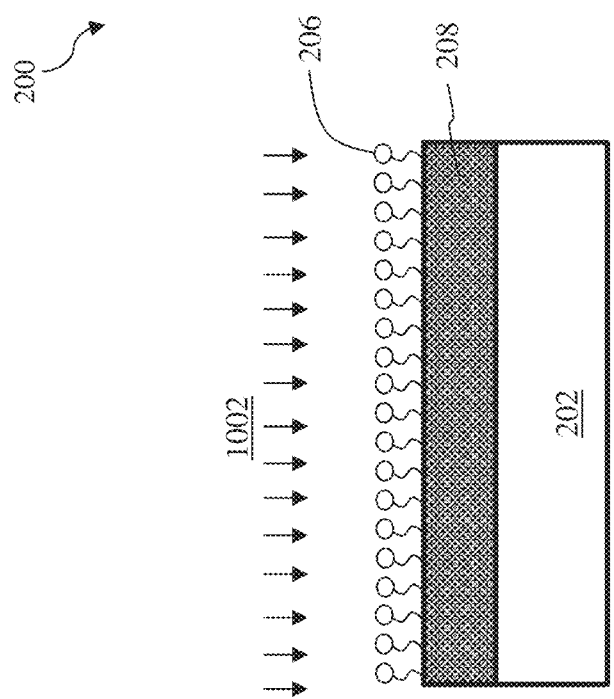

Referring to FIGS. 1 and 5, method 10 includes a block 16 where the first underlayer 204 is cured to form a cured first underlayer 208. In embodiments where the crosslinkable group 104 is a thermal crosslinkable group, block 16 includes a bake process to activate the crosslinkable group 104 to bond to another polymeric backbone other than the polymeric backbone on which the crosslinkable group 104 is bonded, or another crosslinkable group. In embodiments where the crosslinkable group 104 is a UV curable group, block 16 includes a UV curing process to expose the crosslinkable group 104 to UV to activate the crosslinkable group 104 to bond to another polymeric backbone other than the polymeric backbone on which the crosslinkable group 104 is bonded, or another crosslinkable group. In the embodiment illustrated in FIG. 5, the first underlayer 204 undergoes a bake process 1002 at a temperature between about 160° C. and about 250° C. to activate and cure the crosslinkable group 104. While not illustrated in FIG. 5, the present disclosure fully envisions a UV curing process at block 16 to cure the first underlayer 204 when the crosslinkable group 104 in the first underlayer 204 includes a UV curable group.

Figure 6:
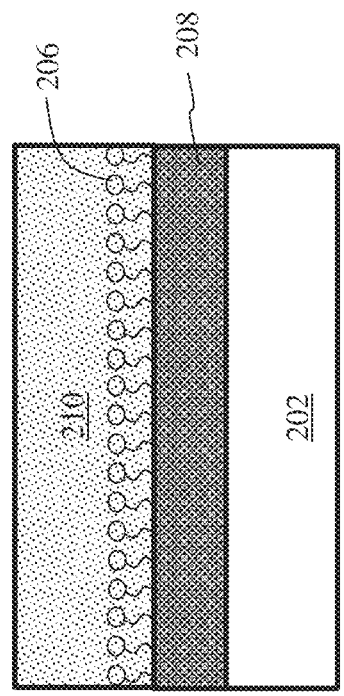

Referring to FIGS. 1 and 6, method 10 includes a block 18 where a photoresist layer 210 is deposited over the cured first underlayer 208. The photoresist layer 210 may be an organic chemically amplified photoresist (CARs) layer, an inorganic photoresist or an organometallic photoresist layer. In the embodiments represented in FIG. 6, the photoresist layer 210 is an organometallic photoresist including a metal, such as tin, zirconium, palladium, cobalt, nickel, chromium, iron, rhodium, or ruthenium. For example, the photoresist layer 210 may include a tin-oxo cage compound, such as [(SnBu)$_{12}$O$_{14}$(OH)$_6$](OH)$_2$. In some implementations, the photoresist layer 210 is deposited directly on the cured first underlayer 208 using spin-on coating. The photoresist layer 210 is a negative-tone photoresist that may undergo chemical changes during an exposure process to become insoluble in a developer solution during a developing process. For example, the photoresist layer 210 may include a photoacid generator that, upon exposure, generates an acid to catalyze crosslinking to make the photoresist layer 210 insoluble in a developer solution.

Referring to FIGS. 1 and 7, method 10 includes a block 20 where a pre-exposure bake process 1004 is performed. The pre-exposure bake process 1004 may also be referred to as a post-application bake process 1004. In some embodiments, a temperature of the pre-exposure bake process 1004 illustrated in FIG. 7 is between about 60° C. and about 170° C. The pre-exposure bake process 1004 may drive out excess solvent in the photoresist layer 210 and cure the photoresist layer 210.

Referring to FIGS. 1 and 8, method 10 includes a block 22 where a portion of the photoresist layer 210 is exposed to a radiation source 1006 according to a pattern of a mask 1008. While the mask 1008 is shown in FIG. 8 as a transmissive mask commonly used with an ArF (argon fluoride) excimer laser radiation source or a KrF (krypton fluoride) excimer laser radiation source, embodiments of the present disclosure are fully applicable to a lithography system including a reflective mask commonly used with an EUV radiation source. In the same vein, the radiation source 1006 may be an ArF excimer laser radiation source, a KrF excimer laser radiation source, or an EUV radiation source. As schematically illustrated in FIG. 8, the mask 1008 includes a pattern such that only a portion 212 of the photoresist layer 210 and a portion 214 of the cured first underlayer 208 is exposed to radiation from the radiation source 1006. The radiation at block 22 not only causes a chemical change in the photoresist layer 210 but also activates the photoacid generator 110 to release an acid moiety. It is noted while the acid labile group 1063 described above may be chemically cleaved in the presence of the acid moiety, the cleavage reaction may not take place at room temperature. In some implementations, the cleavage reaction substantially takes place during the post-exposure bake process at block 24. In embodiments where the photoresist layer 210 includes an inorganic photoresist or an organometallic photoresist, the chemical change brought about by the exposure at block 22 may not require a post-exposure bake process to drive further chemical reaction. In contrast, in embodiments where the photoresist layer 210 includes an organic photoresist, the chemical change brought about by the exposure at block 22 may include release of an acidic moiety from an photoacid generator and a post-exposure bake process is required for the acidic moiety to cause crosslinking.

Referring to FIGS. 1 and 9, method 10 includes a block 24 where a post-exposure bake process 1010 is performed. The acid labile group 1063 of the polarity switchable group 106 may decompose in the presence of the acid moiety released from the photoacid generator 110 during the post-exposure bake process 1010. In some implementations, a baking temperature or a baking temperature profile of the post-exposure bake process 1010 is selected to ensure that the acid labile group 1063 can decompose to sever the second end group 1062 from the polymeric backbone 102 of the cured first underlayer 208. In some implementation, the second end group 1062 has a small molecular weight and is removed from the first underlayer 208 through outgassing during the post-exposure bake process 1010. As the second end group 1062 includes that fluorine-containing group 206 that reduces affinity with the photoresist layer 210, once the second end group 1062 in the exposed portion 214 is removed, the affinity of the photoresist layer 210 to the exposed portion 214 of the cured first underlayer 208 increases. In contrast, because the fluorine-containing group 206 is still present in the unexposed portion 215 of the cured first underlayer 208, the affinity of the photoresist 210 to the unexposed portion 215 is weaker than the affinity of the photoresist layer 210 to the exposed portion 214 of the cured first underlayer 208. The reduced affinity of the unexposed portion 215 due to presence of the fluorine-containing group 206 may facilitate removal of the photoresist layer 210 from the unexposed portion 215 at block 26.

Referring to FIGS. 1 and 10, method 10 includes a block 26 where the exposed portion 212 of the photoresist layer 210 is developed in a developing process 1012 to form a patterned photoresist layer 216. In some embodiments, the developing process 1012 may include use of a developer solution suitable to remove unexposed photoresist 210 while the exposed portion 212 of the photoresist layer 210 remains on the cured first underlayer 208. Because the exposed portion 212 remains after the developing process 1012 and the unexposed portion is removed, the developing process 1012 illustrated in FIG. 10 may be referred to as a negative tone development (NTD) process. Suitable negative-tone developer may include solvents such as n-butyl acetate, ethanol, hexane, benzene, toluene, and/or other suitable solvents when the photoresist layer 210 is organic, and may include water, isopropyl alcohol (IPA), 2-heptanone, or a mixture thereof when the photoresist layer 210 is inorganic or organometallic. In some embodiments, block 26 may also include one or more descum or rinsing processes to remove any residual photoresist layer 210 or debris. In all of these descum or rinsing processes, the reduced affinity of the unexposed portion 215 (to the photoresist layer 210) due to presence of the fluorine-containing group 206 facilitates removal of the photoresist layer 210 from the unexposed portion 215 at block 26, thereby reducing scum, improving process window, and increasing process yield. It is noted that the unexposed portion 215 of the cured first underlayer 208 remains on the substrate 202.

Referring to FIG. 1, method 10 includes a block 28 where the substrate 202 is etched using the photoresist layer 216 as an etch mask. In some embodiments, both the substrate 202 and the cured first underlayer 208 are etched with a dry etch process, such as a reactive ion etch (RIE) process, using the patterned photoresist layer 216 as the etch mask. In some examples, a dry etching process may be implemented using an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a bromine-containing gas (e.g., HBr and/or $CHBr_3$), an iodine-containing gas, other suitable gases and/or plasmas, or combinations thereof. The substrate 202 may include a material layer as the topmost layer of the substrate 202 and the material layer is etched and patterned at block 28, thereby forming a patterned material layer. In some implementations, the material layer may be a spin-on carbon (SOC) layer.

Referring to FIG. 1, method 10 includes a block 30 where further processes are performed. Such further processes may include removing leftover photoresist layer 210 from over the patterned material layer by stripping and the patterned material layer is used as an etch mask to etch further layers and structures under the material layer. Still further processes may be performed to form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements on the workpiece 200.

Operations of the method 10 will be described below with reference to cross-sectional views of a workpiece 400 as shown in FIGS. 12-27 when a second coating solution 300 having constituents shown in FIG. 11 is used to form a second underlayer. The second coating solution 300 may be used to form the second underlayer that is suitable for a positive tone development (PTD) process or an NTD process. An example NTD process with the use of the second coating solution 300 is illustrated in FIGS. 12-19. An example PTD process with the use of the second coating solution is illustrated in FIGS. 20-27.

Figure 12:
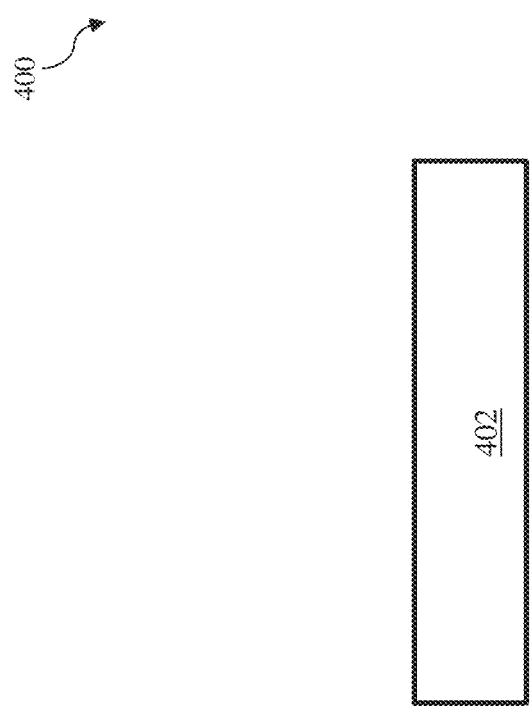

Referring to FIGS. 1 and 12, method 10 includes a block 12 where a substrate 402 is received. The substrate 402 is substantially similar to the substrate 202 and its descriptions are omitted.

Figure 13:
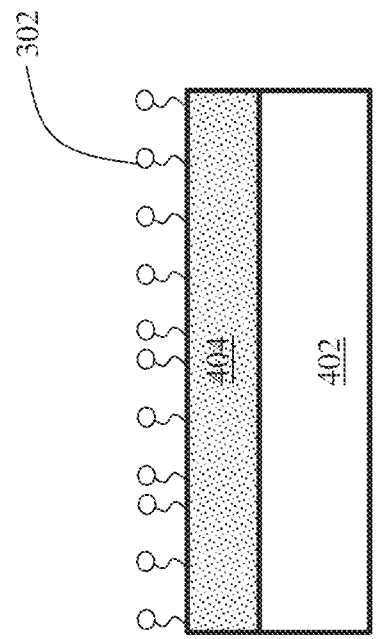

Referring now to FIGS. 1, 11 and 13, method 10 includes a block 14 where a second underlayer 404 is formed over the substrate 402. In some embodiments, the second underlayer 404 may be a bottom antireflective coating (BARC) layer spin-coated on the substrate 402 using a second coating solution 300 schematically shown in FIG. 11. Similar to the first coating solution 100, the second coating solution 300 includes the solvent 101, the polymeric backbone 102, the photoresist affinity group 108, the photoacid generator 110, and the additive 112. Unlike the first coating solution 100, the second coating solution 300 includes a fluorine-containing group 302 bonded directly to the polymeric backbone 102, a polar group 304 directly bonded to the polymeric backbone 102, a crosslinker 306, and a thermal acid generator (TAG) 308. The descriptions of the solvent 101, the polymeric backbone 102, the photoresist affinity group 108, the photoacid generator 110, and the additive 112 have been described above in conjunction with the first coating solution 100 and will not be repeated here.

To illustrate the function of the fluorine-containing group 302, the fluorine-containing group 302 is also label and illustrated in FIGS. 11-19. In terms of composition, the fluorine-containing group 302 may be substantially similar to the fluorine-containing group 206 described above. Instead of bonding to the polymeric backbone 102 via the acid labile group 1063, the fluorine-containing group 302 is directly bonded to the polymeric backbone 102. As a result, the fluorine-containing group 302 will not be removed from the second underlayer 404 during operations of the method 10. The polar group 304 may include a functional group that may react with the crosslinker 306 when an acidic moiety is present to catalyze such a reaction. In some embodiments, the polar group 304 may include a cyclic or a non-cyclic alkyl backbone including 1 to 30 carbon atoms. The polar group 304 may include a functionalized group such as a —I, —Br, —Cl, —NH2, —COOH, —OH, —SH, —N3, —S(=O)—, alkene, alkyne, imine, ether, ester, aldehyde, ketone, amide, sulfone, acetic acid, cyanide, allene, alcohol, diol, amine, phosphine, phosphite, aniline, pyridine, pyrrole group, or a combination thereof. The crosslinker 306 includes a functional group that may be catalyzed by an acidic moiety to crosslink with the polar group 304. The thermal acid generator 308 includes one or more functional groups that may produce an acidic moiety when baked at a suitable temperature. Examples of the thermal acid generator 308 may include:

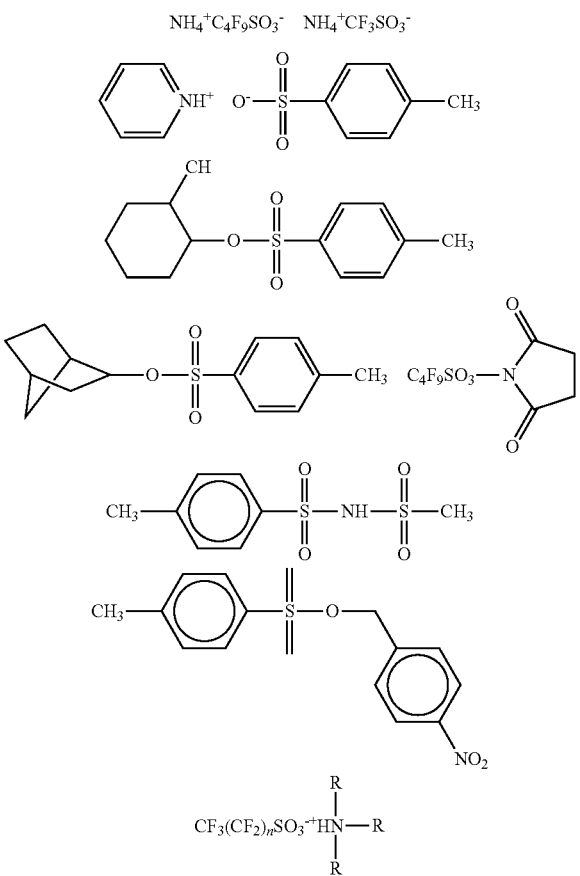

Figure 14:
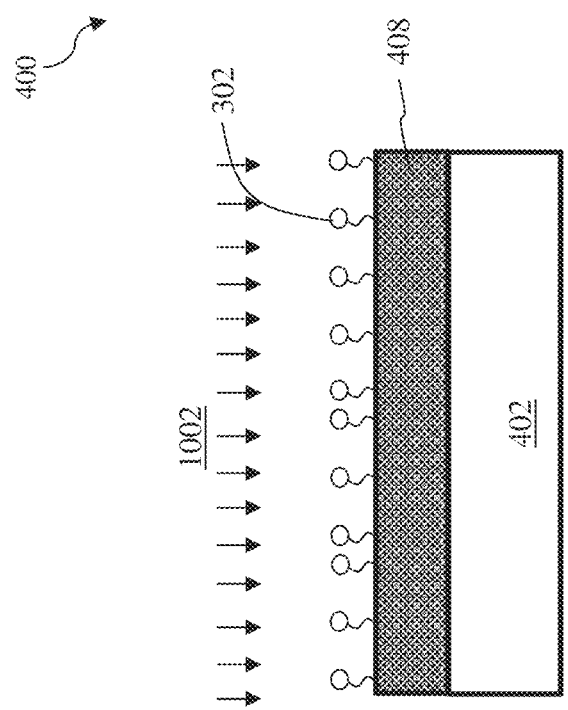

Referring to FIGS. 1 and 14, method 10 includes a block 16 where the second underlayer 404 is cured to form a cured second underlayer 408. In embodiments represented in FIG. 14, the second underlayer 404 is cured using a bake process 1002, which includes a temperature between about 160° C. and about 250° C. At block 16, the bake process 1002 activates the thermal acid generator 308 to generate an acidic moiety. The acidic moiety catalyzes the reaction between the crosslinker 306 and the polar group 304 bonded to the polymeric backbone 102, thereby curing the second underlayer 404 to form the cured second underlayer 408.

Figure 15:
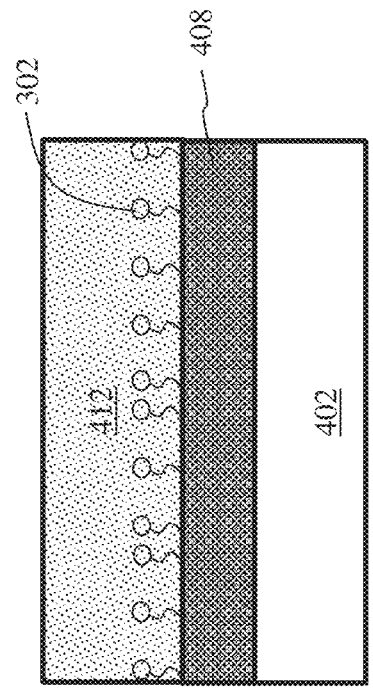

Referring to FIGS. 1 and 15, method 10 includes a block 18 where a photoresist layer 412 is deposited over the cured second underlayer 408. The photoresist layer 412 may be a positive-tone photoresist that may undergo chemical changes during an exposure process to become soluble in a developer solution during a developing process. For example, the photoresist layer 412 may include a photoacid generator that, upon exposure, generates an acid to cleave an acid labile group to make the photoresist layer 412 soluble in an aqueous developer solution. The photoresist layer may be a negative-tone photoresist that may undergo chemical changes during an exposure process to become insoluble in a developer solution during a developing process. For example, the photoresist layer 412 may include a photoacid generator that, upon exposure, generates an acid to catalyze crosslinking to make the photoresist layer 412 insoluble in a developer solution. In embodiments illustrated in FIGS. 15-19, the photoresist layer 412 is a negative-tone photoresist layer.

Figure 16:
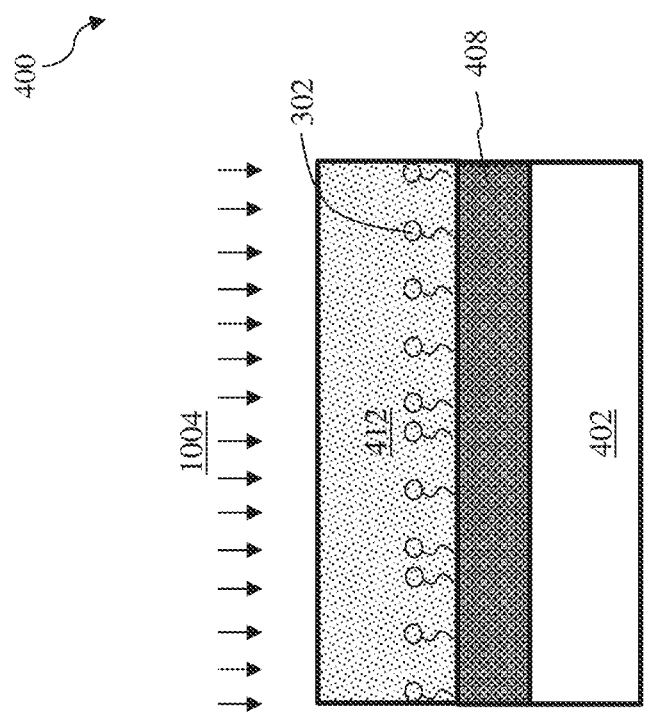

Referring to FIGS. 1 and 16, method 10 includes a block 20 where a pre-exposure bake process 1004 is performed. During the pre-exposure bake process 1004, excess solvent in the photoresist layer 412 is removed.

Figure 17:
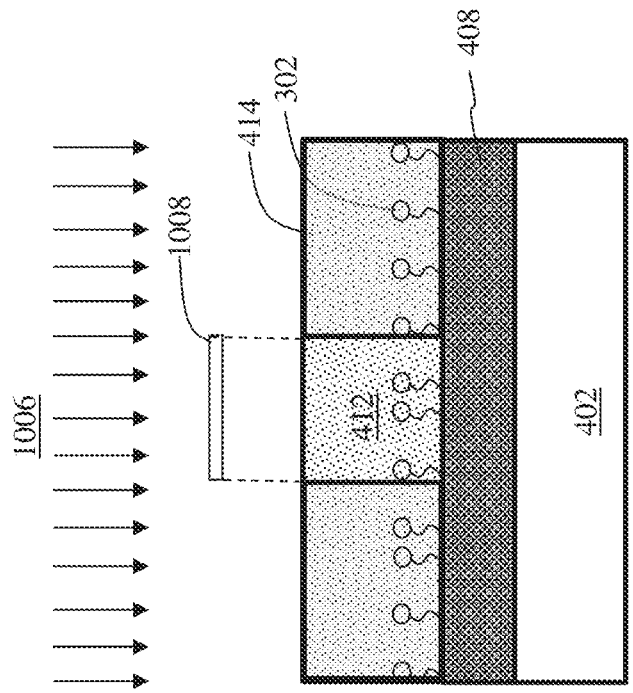

Referring to FIGS. 1 and 17, method 10 includes a block 22 where a portion of the photoresist layer 412 is exposed to a radiation source 1006 according to a pattern of a mask 1008. Descriptions of the radiation source 1006 and the mask 1008 have been provided above and will not be repeated here. It is noted again that because the fluorine-containing group 302 is directly bonded to the polymeric backbone 102, exposure to radiation from the radiation source 1006 does not trigger any cleavage reaction to remove the fluorine-containing group 302 from the cured second underlayer 408. In embodiments where the negative-tone photoresist layer 412 includes an inorganic photoresist or an organometallic photoresist, the chemical change brought about by the exposure at block 22 may not require a post-exposure bake process to drive further chemical reaction. In contrast, in embodiments where the negative-tone photoresist layer 412 includes an organic photoresist, the chemical change brought about by the exposure at block 22 may include release of an acidic moiety from an photoacid generator and a post-exposure bake process is required for the acidic moiety to cause crosslinking.

Referring to FIGS. 1 and 18, method 10 includes a block 24 where a post-exposure bake process 1010 is performed. In some embodiments, the post-exposure bake process 1010 does not have any substantial effect on the cured second underlayer 408 as the exposure process at block 22 does not generate any chemical species to initiate any further chemical reaction. In those embodiments, the necessity to have the post-exposure bake process 1010 depend on whether it is required to drive further reaction in the exposed portion 414 of photoresist layer 412. In instances where the photoresist layer 412 includes an inorganic photoresist or an organometallic photoresist, the post-exposure bake process 1010 may be omitted because the chemical change in the photoresist layer 412 does not require thermal energy input. In instances where the photoresist layer 412 includes an organic photoresist, the post-exposure bake process 1010 may be needed as the acidic moiety or the basic moiety generated at block 22 may require thermal energy to cause crosslinking.

Referring to FIGS. 1 and 19, method 10 includes a block 26 where the exposed portion 414 of the photoresist layer 412 is developed in a developing process 1012 to form a patterned photoresist layer 416. In some embodiments, the developing process 1012 may include use of a developer solution suitable to remove unexposed portion of the photoresist layer 412 while the exposed portion 414 of the photoresist layer 412 remains on the cured second underlayer 408. Because the exposed portion 414 remains after the developing process 1012 and the unexposed portion is removed, the developing process 1012 illustrated in FIG. 19 may be referred to as an NTD process. Suitable negative-tone developer may include solvents such as n-butyl acetate, ethanol, hexane, benzene, toluene, and/or other suitable solvents when the photoresist layer 210 is organic, and may include water, isopropyl alcohol (IPA), 2-heptanone, or a mixture thereof when the photoresist layer 210 is inorganic or organometallic. In some embodiments, block 26 may also include one or more descum or rinsing processes to remove any residual photoresist layer 412 or debris. In all of these descum or rinsing processes, the reduced affinity of the cured second underlayer 408 (to the photoresist layer 412) due to presence of the fluorine-containing group 302 facilitates removal of the residual photoresist layer 412 from the cured second underlayer 408 at block 26, thereby reducing scum, improving process window, and increasing process yield. It is noted that the unexpected portion of the cured second underlayer 408 remains on the substrate 402.

Referring to FIG. 1, method 10 includes a block 28 where the substrate 402 is etched using the photoresist layer 416 as an etch mask. In some embodiments, both the substrate 402 and the cured second underlayer 408 are etched with a dry etch process, such as a reactive ion etch (RIE) process, using the patterned photoresist layer 416 as the etch mask. In some examples, a dry etching process may be implemented using an etchant gas that includes a fluorine-containing etchant gas (e.g., $NF_3$, $CF_4$, $SF_6$, $CH_2F_2$, $CHF_3$, and/or $C_2F_6$), an oxygen-containing gas (e.g., $O_2$), a chlorine-containing gas (e.g., $Cl_2$, $CHCl_3$, $CCl_4$, $SiCl_4$, and/or $BCl_3$), a bromine-containing gas (e.g., HBr and/or $CHBr_3$), an iodine-containing gas, other suitable gases and/or plasmas, or combinations thereof. In some implementations, the substrate 402 may include a material layer as the topmost layer of the substrate 402 and the material layer is etched and patterned at block 28, thereby forming a patterned material layer. In some implementations, the material layer may be a spin-on carbon (SOC) layer.

Referring to FIG. 1, method 10 includes a block 30 where further processes are performed. Such further processes may include removing leftover photoresist layer 412 from over the patterned material layer by stripping and the patterned material layer is used as an etch mask to etch further layers and structures under the material layer. Still further processes may be performed to form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements on the workpiece 400.

The second coating solution 300 may be used to form a second underlayer 504 in a PTD process where a pattern of the mask 1008 is transferred to a positive-tone photoresist layer 512 (FIG. 23), rather than the negative-tone photoresist layer 412. Method 10 may be implemented with use of the positive-tone photoresist layer 512 and the second coating solution 300 and the operations are described below in conjunction with FIGS. 20-27.

Figure 21:
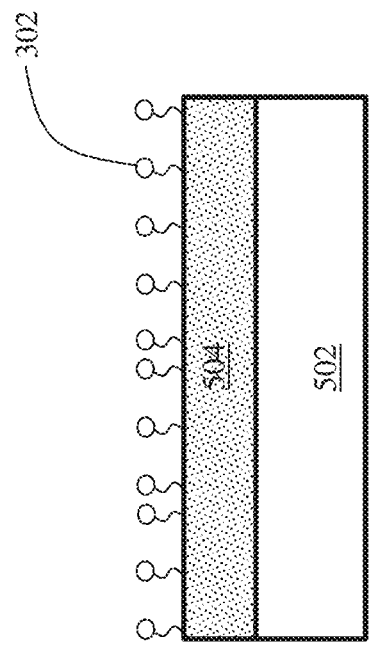
Figure 20:
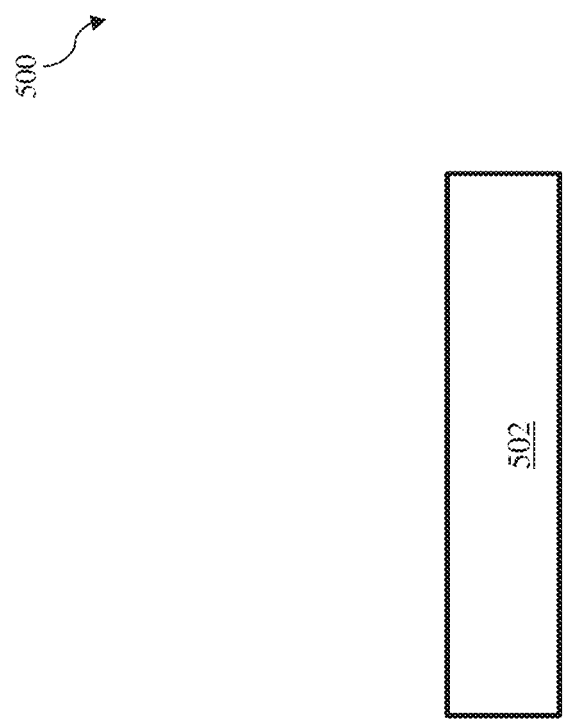
Figure 23:
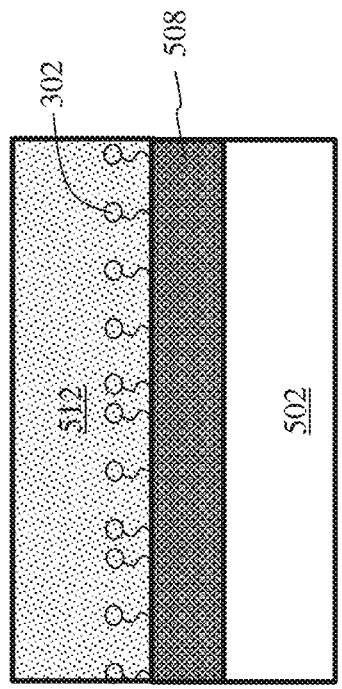
Figure 22:
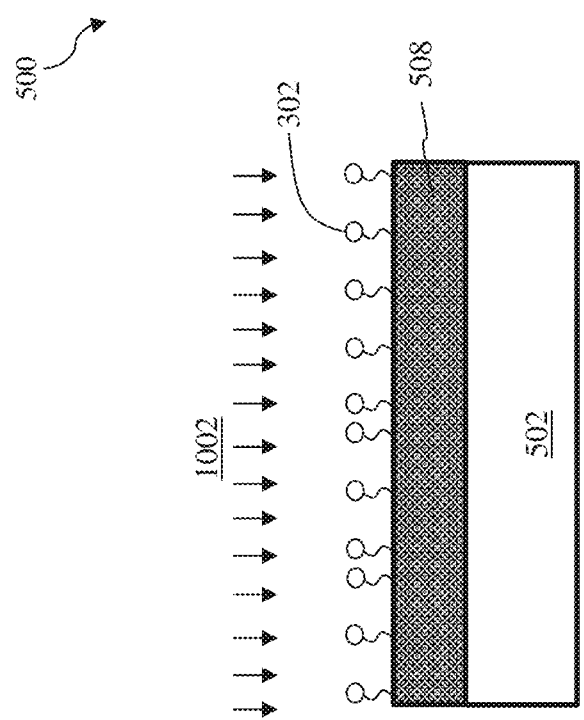

Referring to FIGS. 1 and 20, method 10 includes a block 12 where a substrate 502 is received. The substrate 502 is substantially similar to the substrate 202 and its descriptions are omitted. The substrate 502 along with any layers formed thereon may be referred to as the workpiece 500. Referring to FIGS. 1, 11 and 21, method 10 includes a block 14 where a second underlayer 504 is formed over the substrate 502. The second underlayer 504 is substantially similar to the second underlayer 404 and its descriptions are omitted. Referring now to FIGS. 1 and 22, method 10 includes a block 16 where the second underlayer 504 is cured in a bake process 1002 to form a cured second underlayer 508. Descriptions of the curing of the second underlayer 504 and the bake process 1002 have been described above with respect to the second underlayer 404 and will not be repeated here. Referring to FIGS. 1 and 23, method 10 includes a block 18 where the photoresist layer 512 is deposited over the cured second underlayer 508. The photoresist layer 512 is a positive-tone photoresist layer and may be deposited using spin-on coating. Referring to FIGS. 1 and 24, method 10 includes a block 20 where a pre-exposure bake process 1004 is performed to render the positive-tone photoresist layer 512 soluble in a developer solution. Different from the negative-tone photoresist layer 412, the photoresist layer 512 may include a photoacid generator that may generate an acid moiety to cleave an acid labile group to change hydrophobicity of the photoresist layer 512.

Referring to FIGS. 1 and 25, method 10 includes a block 22 where a portion 514 of the photoresist layer 512 is exposed to a pattern of radiation. Descriptions of the radiation source 1006 and the mask 1008 have been provided above and will not be repeated here. It is noted again that because the fluorine-containing group 302 is directly bonded to the polymeric backbone 102, exposure to radiation from the radiation source 1006 does not trigger any cleavage reaction to remove the fluorine-containing group 302 from the cured second underlayer 508. In embodiments where the positive-tone photoresist layer 512 includes an inorganic photoresist or an organometallic photoresist, the chemical change brought about by the exposure at block 22 may not require a post-exposure bake process to drive further chemical reaction. In contrast, in embodiments where the positive-tone photoresist layer 512 includes an organic photoresist, the chemical change brought about by the exposure at block 22 may include release of an acidic moiety from an photoacid generator and a post-exposure bake process is required for the acidic moiety to change solubility of the positive-tone photoresist layer 512. Referring to FIGS. 1 and 26, method 10 includes a block 24 where a post-exposure bake process 1010 is performed. The necessity to have the post-exposure bake process 1010 depends on whether it is required to drive further reaction in the exposed portion 514 of photoresist layer 512. In instances where the photoresist layer 512 includes an inorganic photoresist or an organometallic photoresist, the post-exposure bake process 1010 may be omitted because the chemical change in the photoresist layer 512 does not require thermal energy input. In instances where the photoresist layer 512 includes an organic photoresist, the post-exposure bake process 1010 may be needed as the acidic moiety generated at block 22 may require thermal energy to make the exposed portion 514 soluble in a developer solution to be used at block 26.

Referring to FIGS. 1 and 27, method 10 includes a block 26 where the exposed portion 514 of the photoresist layer 512 is developed in a developing process 1012 to form a patterned photoresist layer 516. In some embodiments, the developing process 1012 may include use of a developer solution suitable to remove exposed portion 514 of the positive photoresist layer 512 while the unexposed portion of the photoresist layer 512 remains on the cured second underlayer 508. Suitable positive-tone developers include tetramethyl ammonium hydroxide (TMAH), KOH, NaOH, and/or other suitable solvents. In some implementations, block 26 may also include one or more descum or rinsing processes to remove any residual photoresist layer 512 or debris. In all of these descum or rinsing processes, the reduced affinity of the cured second underlayer 508 (to the photoresist layer 512) due to presence of the fluorine-containing group 302 facilitates removal of the any residual photoresist layer 512 from the cured second underlayer 508 at block 26, thereby reducing scum, improving process window, and increasing process yield. It is noted that the expected portion of the cured second underlayer 508 remains on the substrate 502.

Referring to FIG. 1, method 10 includes a block 28 where the substrate 502 is etched using the patterned photoresist layer 516 as an etch mask. In some embodiments, both the substrate 502 and the cured second underlayer 508 are etched with a dry etch process, such as a reactive ion etch (RIE) process, using the patterned photoresist layer 516 as the etch mask. Suitable dry etchants have been described above and will not be repeated here. In some implementations, the substrate 502 may include a material layer as the topmost layer of the substrate 502 and the material layer is etched and patterned at block 28, thereby forming a patterned material layer. In some implementations, the material layer may be a spin-on carbon (SOC) layer. Referring to FIG. 1, method 10 includes a block 30 where further processes are performed. Such further processes may include removing leftover photoresist layer 512 from over the patterned material layer by stripping and the patterned material layer is used as an etch mask to etch further layers and structures under the material layer. Still further processes have been described above and will not be repeated here.

Operations of the method 10 will be described below with reference to cross-sectional views of a workpiece 700 as shown in FIGS. 29-37 when a third coating solution 600 having constituents shown in FIG. 28 is used to form a third underlayer.

Referring to FIGS. 1 and 29, method 10 includes a block 12 where a substrate 702 is received. The substrate 702 is substantially similar to the substrate 202 and its descriptions are omitted.

Referring to FIGS. 1, 28 and 30, method 10 includes a block 14 where a third underlayer 704 is formed over the substrate 702. In some embodiments, the third underlayer 704 may be a bottom antireflective coating (BARC) layer spin-coated on the substrate 702 using a third coating solution 600 schematically shown in FIG. 28. Similar to the second coating solution 300, the third coating solution 600 includes the solvent 101, the polymeric backbone 102, the photoresist affinity group 108, the additive 112, the polar group 304, and the thermal acid generator 308. Unlike the second coating solution 300, the third coating solution 600 includes an acid labile group 602 bonded to the polymeric backbone 102, a UV curable group 604 bonded to the polymeric backbone 102, and a photobase generator 606. That is, the acid labile group 602 serves as a bridge between the polymeric backbone 102 and the UV curable group 604. The descriptions of the solvent 101, the polymeric backbone 102, the photoresist affinity group 108, the photoacid generator 110, the additive 112, the polar group 304, and the thermal acid generator 308 have been described above in conjunction with the first coating solution 100 and the second coating solution 300 and will not be repeated here for brevity.

The acid labile group 602 may be cleaved in the presence of an acidic moiety, thereby severing the UV curable group from the polymeric backbone 102. The acid moiety may be generated by activation of the thermal acid generator 308. As the UV curable group 604 is used to crosslink to another UV curable group or another polymeric backbone, cleavage of the acid labile group 602 also decouple the crosslink. The acid labile group 602 may have a cyclic structure or a non-cyclic alkyl structure and may include an aromatic ring or a non-aromatic ring. In some embodiments, the acid labile group 602 may include ester, amide, imine, acetal, ketal, anhydride, sulfonic ester, a t-Butyl group, a tert-Butoxycarbonyl group, an iso-Norbornyl group, a 2-Methyl-2-adamantyl group, a 2-Ethyl-2-adamantyl group, a 3-THF, Lactone group, a 2-THF group, or a 2-THP group. The acid labile group 602 may include a functionalized group such as —I, —Br, —Cl, —NH2, —COOH, —OH, —SH, —N3, —S(=O)—, alkene, alkyne, imine, ether, vinyl ether, acetal, hemiacetal, ester, aldehyde, ketone, amide, sulfone, acetic acid, cyanide, allene, or imine.

The UV curable group 604 may include an alkyl backbone having 3 to 30 carbon atoms. In some embodiments, the UV curable group 604 includes at least one light-sensitive functional group such as epoxy, azo compounds, alkyl halide, imine, alkene, alkyne, peroxide, ketone, aldehyde, allene, aromatic groups or heterocyclic groups. The aromatic structures can be phenyl, napthlenyl, phenanthrenyl, anthracenyl, phenalenyl, and other aromatic derivatives containing three to ten-membered rings. Upon exposure to UV, one or more radicals may be formed on the UV curable group 604, allowing it to bond to another UV curable group or another polymeric backbone through radical polymerization reaction.

The photobase generator 606 may be photosensitive and decomposed to provide a basic moiety upon exposure to radiation of a suitable wavelength range. Non-limiting examples of the PBGs provided herein include the following structures:

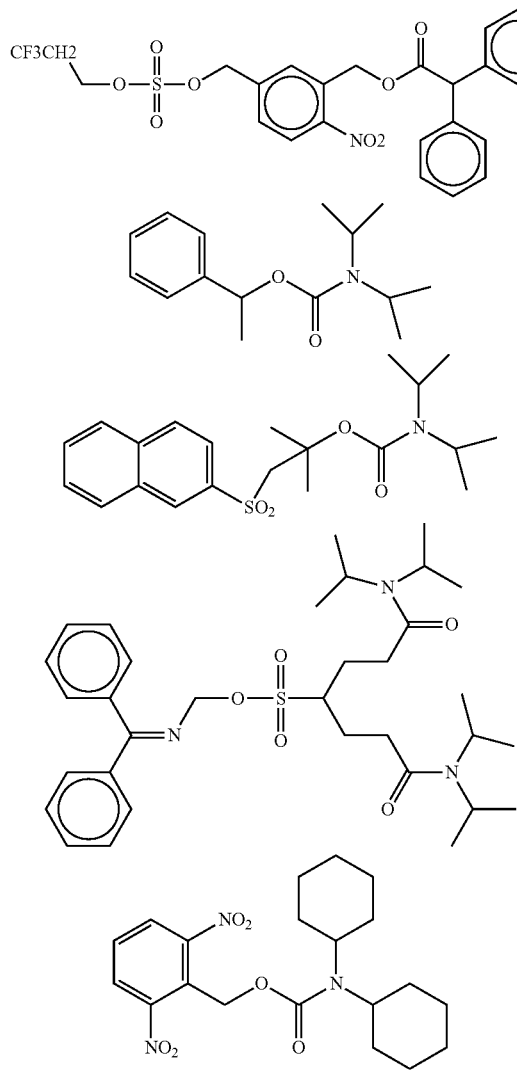

Figure 31:
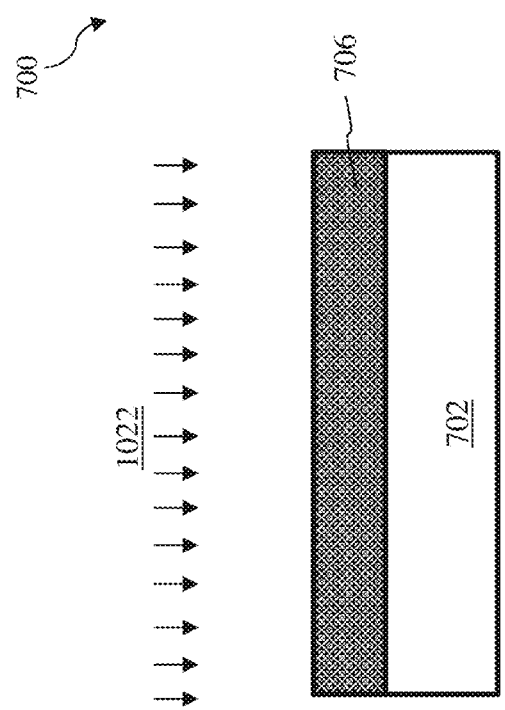

Referring to FIGS. 1 and 31, method 10 includes a block 16 where the third underlayer 704 is cured to form a cured third underlayer 706. When the third underlayer 704 is formed using the third coating solution 600, the third underlayer 704 is cured using a UV curing process 1022. UV radiation at the UV curing process 1022 activates the UV curable group 604 to form crosslinks, thereby curing the third underlayer 704. It is noted that the acid labile group 602 remains intact at block 16 as the acid labile group 602 is not sensitive to UV. It is also noted that the third coating solution 600 does not include any photoacid generator, which may generate an acidic moiety to cleave the acid labile group 602.

Figure 32:
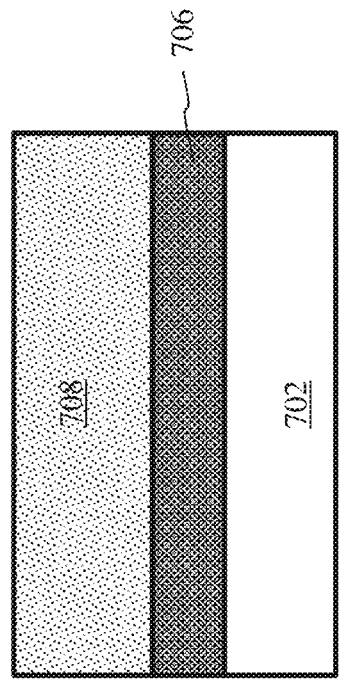

Referring to FIGS. 1 and 32, method 10 includes a block 18 where a photoresist layer 708 is deposited over the cured third underlayer 706. The photoresist layer 708 is negative-tone photoresist. Suitable negative-tone developer may include solvents such as n-butyl acetate, ethanol, hexane, benzene, toluene, and/or other suitable solvents when the photoresist layer 210 is organic, and may include water, isopropyl alcohol (IPA), 2-heptanone, or a mixture thereof when the photoresist layer 210 is inorganic or organometallic. The photoresist layer 708 may be an organic chemically amplified photoresist (CARs) layer, an inorganic photoresist or an organometallic photoresist layer. In the embodiments represented in FIG. 32, the photoresist layer 708 is an organometallic photoresist including a metal, such as tin, zirconium, palladium, cobalt, nickel, chromium, iron, rhodium, or ruthenium. For example, the photoresist layer 708 may include a tin-oxo cage compound, such as $[(SnBu)_{12}O_{14}(OH)_6](OH)_2$. In some implementations, the photoresist layer 708 is deposited directly on the cured third underlayer 706 using spin-on coating.

Referring to FIGS. 1 and 33, method 10 includes a block 20 where a low-temperature bake process 1014 is performed. In some embodiments, a temperature of the low-temperature bake process 1014 is selected such that the acid labile group 602 is not cleaved by operation of the thermal energy on the thermal acid generator 308. That is, the temperature of the low-temperature bake process 1014 is lower than a threshold temperature to decompose the thermal acid generator 308. In some embodiments, the temperature for the low-temperature bake process 1014 is between about 60° C. and about 150° C. and the threshold voltage to decompose the thermal acid generator 308 is about 160° C.

Referring to FIGS. 1 and 34, method 10 includes a block 22 where a portion 712 of the photoresist layer 708 is exposed to a pattern of radiation. Descriptions of the radiation source 1006 and the mask 1008 have been provided above and will not be repeated here. As described above, the photoresist layer 708 is a negative-tone photoresist layer. In embodiments where the negative-tone photoresist layer 708 includes an inorganic photoresist or an organometallic photoresist, the chemical change brought about by the exposure at block 22 may not require a post-exposure bake process to drive further chemical reaction. In contrast, in embodiments where the negative-tone photoresist layer 708 includes an organic photoresist, the chemical change brought about by the exposure at block 22 may include release of an acidic moiety from an photoacid generator and a post-exposure bake process is required for the acidic moiety to cause crosslinking. At block 22, a portion 714 of the cured third underlayer 706 is also exposed to radiation from the radiation source 1006. The radiation decomposes the photobase generator 606 in the exposed portion 714 of the cured third underlayer 706 to produce a basic moiety 716 in the cured third underlayer 706.

Figure 36:
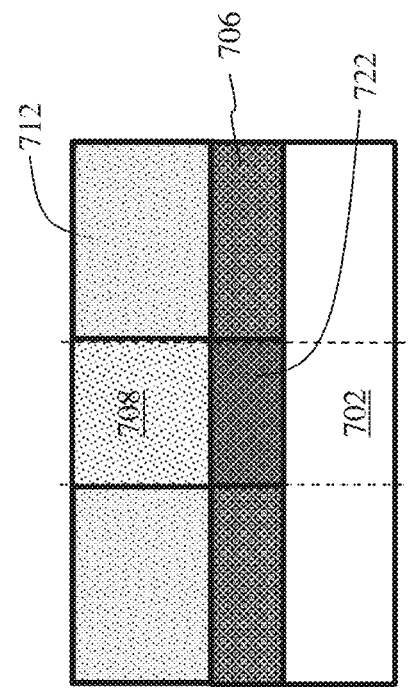
Figure 35:
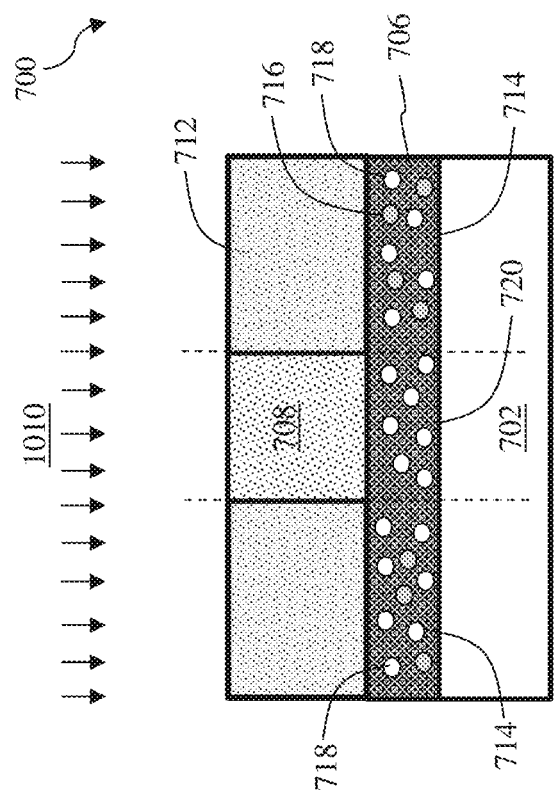

Referring to FIGS. 1, 35 and 36, method 10 includes a block 24 where a post-exposure bake process 1010 is performed. The temperature of the post-exposure bake process 1010 is selected to be greater than the threshold temperature to decompose the thermal acid generator 308 to provide an acidic moiety 718, illustrated in FIG. 35. In some embodiments, the temperature of the post-exposure bake process 1010 is between about 160° C. and about 250° C. In embodiments where the photoresist layer 708 includes an inorganic photoresist or an organometallic photoresist, the chemical change brought about by the exposure at block 22 may not require a post-exposure bake process to drive further chemical reaction. In contrast, in embodiments where the photoresist layer 708 includes an organic photoresist, the chemical change brought about by the exposure at block 22 may include release of an acidic moiety from an photoacid generator, and a post-exposure bake process 1010 is required for the acidic moiety to cause crosslinking. As illustrated in FIG. 35, the acidic moiety 718 in the exposed portion 714 of the cured third underlayer 706 is neutralized by the basic moiety 716 generated at block 22 while the acidic moiety 718 in the unexposed portion 720 of the cured third underlayer 706 is not met with any basic moiety 716. In some embodiments, substantially all of the acidic moiety 718 in the exposed portion 714 of the cured third underlayer 706 is neutralized, leaving no acidic moiety 718 to cleave the acid labile group 602 during the post-exposure bake process 1010. In some other embodiments, the amount of acidic moiety 718 in the exposed portion 714 is reduced to a level substantially smaller than that of the amount of acidic moiety 718 in the unexposed portion 720. As shown in FIG. 36, the acidic moiety 718 may decompose the acid labile group 602, resulting in decoupling of the crosslink made possible by the UV curable group 604. The decrosslinking in the unexposed portion 720 transforms the unexposed portion 720 into a transformed portion 722, which may be removed in the developing process at block 26. Due to lack or reduced amount of acidic moiety 718 in the exposed portion 714, the exposed portion 714 is not removable in the developing process at block 26.

Referring to FIGS. 1 and 37, method 10 includes a block 26 where the exposed portion of the photoresist layer 708 is developed in a developing process 1012 to form a patterned photoresist layer 724. As shown in FIG. 37, the developing process 1012 includes use of a developer selected to dissolve the unexposed portion of the photoresist layer 708 as well as the transformed portion 722 of the cured third underlayer 706, exposing a top surface of the substrate 702. The developer may remove the unexposed portion of the photoresist layer 708 because the unexposed portion is not crosslinked. The developer may remove the transformed portion 722 because it has been decrosslinked by operation of the acidic moiety 718 and thermal energy of the post-exposure bake process 1010.

Referring to FIG. 1, method 10 includes a block 28 where the substrate 702 is etched using the patterned photoresist layer 724 as an etch mask. In some embodiments, the substrate 702 is etched with a dry etch process, such as a reactive ion etch (RIE) process, using the patterned photoresist layer 724 as the etch mask. Suitable dry etchants have been described above and will not be repeated here. In some implementations, the substrate 702 may include a material layer as the topmost layer of the substrate 702 and the material layer is etched and patterned at block 28, thereby forming a patterned material layer. In some implementations, the material layer may be a spin-on carbon (SOC) layer.

Referring to FIG. 1, method 10 includes a block 30 where further processes are performed. Such further processes may include removing leftover photoresist layer 708 from over the patterned material layer by stripping and the patterned material layer is used as an etch mask to etch further layers and structures under the material layer. Still further processes may be performed to form various passive and active microelectronic devices such as resistors, capacitors, inductors, diodes, metal-oxide semiconductor field effect transistors (MOSFET), complementary metal-oxide semiconductor (CMOS) transistors, bipolar junction transistors (BJT), laterally diffused MOS (LDMOS) transistors, high power MOS transistors, other types of transistors, and/or other circuit elements on the workpiece 700.

Although not intended to be limiting, one or more embodiments of the present disclosure provide many benefits to a semiconductor device and a formation process thereof. For example, the present disclosure discloses coating solutions for depositing of an underlayer that reduce scum formation as well as methods of depositing an underlayer using the disclosed coating solutions. In some embodiments, a first underlayer formed using a first coating solution includes a fluorine-containing group that may be cleaved off after being exposed to a radiation source. Because the fluorine-containing group reduces the affinity between the photoresist layer and the first underlayer, less residual photoresist material or scum may remain on the first underlayer after the exposed photoresist layer is developed. In some other embodiments, a second underlayer formed using a second coating solution includes a permanently bonded fluorine-containing group. Because the fluorine-containing group reduces the affinity between the photoresist layer and the second underlayer, less residual photoresist material or scum may remain after the exposed photoresist layer is developed. In still some other embodiments, a third underlayer formed using a third coating solution includes a photobase generator and a thermal acid generator. Because unexposed third underlayer may be selectively removed along with the unexposed photoresist in a negative tone development (NTD) process, less residual photoresist material or scum may remain after the exposed photoresist layer is developed. By reducing the amount of leftover photoresist/scum, embodiments of the present disclosure enlarge process windows and improve yield.

The present disclosure provides embodiments of methods of forming the semiconductor devices and compositions of underlayers to be used with the disclosed methods. In one embodiment, a method is provided. The method includes providing a substrate, depositing an underlayer over the substrate, which underlayer includes a polymer backbone, a polarity switchable group comprising a first end group bonded to the polymer backbone, a second end group comprising fluorine, and an acid labile group bonded between the first end group and the second end group, a cross-linkable group bonded to the polymer backbone, and a photoacid generator, depositing a photoresist layer over the underlayer, exposing a portion of the photoresist layer and a portion of the underlayer to a radiation source according to a pattern, thereby decomposing the photoacid generator in the exposed portion of the underlayer to generate an acidity moiety, baking the photoresist layer and underlayer so that the acidity moiety reacts with the acid labile group to detach the second end group from the polymer backbone, and developing the exposed portion of the photoresist layer to transfer the pattern to the photoresist layer.

In some embodiments, the depositing of the photoresist layer includes depositing the photoresist layer directly on the underlayer. In some implementations, the method further includes before the depositing of the photoresist layer, baking the deposited underlayer to activate the cross-linkable group for bonding to another polymer backbone. In some embodiments, the method includes, before the depositing of the photoresist layer, exposing the deposited underlayer to an ultraviolet (UV) source to activate the cross-linkable group for bonding to another polymer backbone. In some embodiments, the radiation source includes an ArF excimer laser, a KrF excimer laser, or an extreme ultraviolet (EUV) radiation source. In some instances, the photoresist layer is an organometallic photoresist including a metal selected from a group consisting of tin, palladium, zirconium, cobalt, nickel, chromium, iron, rhodium, and ruthenium. In some implementations, the underlayer further includes a photoresist affinity group bonded to the polymer backbone, the photoresist affinity group includes between 1 and 30 carbon atoms, and an affinity between the photoresist layer and the photoresist affinity group is greater than an affinity between the photoresist layer and the second end group of the polarity switchable group.

In another embodiment, a method is provided. The method includes providing a substrate, depositing an underlayer over the substrate, which underlayer includes a polymer backbone, a fluorine-containing group bonded to the polymer backbone, a polar group bonded to the polymer backbone, a thermal cross-linkable group bonded to the polymer backbone, a crosslinker, and a thermal acid generator comprising an acidic moiety configured to catalyze bonding between the polar group and the crosslinker, depositing a photoresist layer over the underlayer, exposing a portion of the photoresist layer to a radiation source according to a pattern, baking the photoresist layer, and developing the exposed portion of the photoresist layer to transfer the pattern to the photoresist layer.

In some embodiments, the depositing of the photoresist layer includes depositing the photoresist layer directly on the underlayer. In some embodiments, the method further includes before the depositing of the photoresist layer, baking the deposited underlayer to activate the thermal acid generator to release the acidic moiety for bonding the polar group and the crosslinker. In some implementations, the radiation source includes an ArF excimer laser, a KrF excimer laser, or an extreme ultraviolet (EUV) radiation source. In some embodiments, the photoresist layer is an organometallic photoresist including a metal selected from a group consisting of tin, palladium, zirconium, cobalt, nickel, chromium, iron, rhodium, and ruthenium. In some instances, the underlayer further includes a photoresist affinity group bonded to the polymer backbone, the photoresist affinity group includes between 1 and 30 carbon atoms, and an affinity between the photoresist layer and the photoresist affinity group is greater than an affinity between the photoresist layer and a fluorine-containing group.

In yet another embodiment, a method is provided. The method includes providing a substrate, depositing an underlayer over the substrate, which underlayer includes a polymer backbone, an acid labile group bonded to the polymer backbone, an ultraviolet (UV) curable group bonded to the acid labile group, a thermal acid generator configured to release an acidic moiety at a first temperature, and a photobase generator configured to release a basic moiety upon exposure to a radiation source, depositing a photoresist layer over the underlayer, baking the photoresist layer at a second temperature lower than the first temperature, exposing a portion of the photoresist layer and a portion of the underlayer to the radiation source according to a pattern, thereby releasing the basic moiety from the photobase generator, baking the underlayer at the first temperature, thereby releasing the acidic moiety to neutralize the basic moiety, and developing the exposed portion of the photoresist layer and the exposed portion of the underlayer to transfer the pattern to the photoresist layer and the underlayer.

In some embodiments, the depositing of the photoresist layer includes depositing the photoresist layer directly on the underlayer. In some implementations, the photoresist layer is an organometallic photoresist including a metal selected from a group consisting of tin, palladium, zirconium, cobalt, nickel, chromium, iron, rhodium, and ruthenium. In some embodiments, the method further includes before the depositing of the photoresist layer, exposing the deposited underlayer to an ultraviolet (UV) source to activate the UV curable group for bonding to another polymer backbone. In some implementations, the first temperature is between about 160° C. and about 250° C. In some instances, the second temperature is between about 60° C. and about 150° C. In some implementations, the radiation source includes an ArF excimer laser, a KrF excimer laser, or an extreme ultraviolet (EUV) radiation source.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
providing a substrate;
depositing a bottom anti-reflection layer over the substrate, wherein the bottom anti-reflection layer comprises:
a polymer backbone,
a polarity switchable group comprising a first end group bonded directly to the polymer backbone, a second end group comprising fluorine, and an acid labile group bonded between the first end group and the second end group,
a photoresist affinity group bonded directly to the polymer backbone,
a cross-linkable group bonded directly to the polymer backbone, and
a photoacid generator;
depositing a photoresist layer over the bottom anti-reflection layer;
exposing a portion of the photoresist layer and a portion of the bottom anti-reflection layer to an extreme UV (EUV) radiation source according to a pattern, thereby decomposing the photoacid generator in the exposed portion of the bottom anti-reflection layer to generate an acidity moiety;
baking the photoresist layer and bottom anti-reflection layer so that the acidity moiety reacts with the acid labile group to detach the second end group from the polymer backbone; and
developing the exposed portion of the photoresist layer to transfer the pattern to the photoresist layer,
wherein the acid labile group comprises a carboxyl bond,
wherein the photoresist affinity group consists essentially of —I, —Br, —Cl, —NH$_2$, —SH, —N$_3$, —S(=O)—, imine, aldehyde, amide, and sulfone.

2. The method of claim 1, wherein the depositing of the photoresist layer comprises depositing the photoresist layer directly on the bottom anti-reflection layer.

3. The method of claim 2, further comprising:
before the depositing of the photoresist layer, baking the deposited bottom anti-reflection layer to activate the cross-linkable group for bonding to another polymer backbone.

4. The method of claim 2, further comprising,
before the depositing of the photoresist layer, exposing the deposited bottom anti-reflection layer to an ultraviolet (UV) source to activate the cross-linkable group for bonding to another polymer backbone.

5. The method of claim 1, wherein the photoresist layer is an organometallic photoresist comprising a metal selected from a group consisting of tin, palladium, zirconium, cobalt, nickel, chromium, iron, rhodium, and ruthenium.

6. The method of claim 1,
wherein the photoresist affinity group comprises between 1 and 30 carbon atoms,
wherein an affinity between the photoresist layer and the photoresist affinity group is greater than an affinity between the photoresist layer and the second end group of the polarity switchable group.

7. The method of claim 1, wherein a composition of the bottom anti-reflection layer is different from a composition of the photoresist layer.

8. A method comprising:
providing a substrate;
depositing a bottom anti-reflection layer over the substrate, wherein the bottom anti-reflection layer comprises:
a polymer backbone,
a polarity switchable group bonded directly to the polymer backbone,
a cross-linkable group bonded directly to the polymer backbone,
a photoresist affinity group bonded directly to the polymer backbone, and
a photoacid generator;
depositing a photoresist layer over the bottom anti-reflection layer;
exposing a portion of the photoresist layer and a portion of the bottom anti-reflection layer to an extreme UV (EUV) radiation source according to a pattern;
baking the photoresist layer and bottom anti-reflection layer; and
developing the exposed portion of the photoresist layer to transfer the pattern to the photoresist layer,
wherein the polarity switchable group comprises an acid labile group and the acid labile group comprises a carboxyl bond,
wherein the photoresist affinity group consists essentially of —I, —Br, —Cl, —NH$_2$, —SH, —N$_3$, —S(=O)—, imine, aldehyde, amide, and sulfone.

9. The method of claim 8, wherein the exposing decomposes the photoacid generator in the exposed portion of the bottom anti-reflection layer to generate an acidity moiety.

10. The method of claim 9, wherein the polarity switchable group further comprises:
a first end group bonded to the polymer backbone; and
a second end group comprising fluorine,
wherein the acid labile group is bonded between the first end group and the second end group.

11. The method of claim 10, the baking causes the acidity moiety to react with the acid labile group to detach the second end group from the polymer backbone.

12. The method of claim 10,
wherein the photoresist affinity group comprises between 1 and 30 carbon atoms,
wherein an affinity between the photoresist layer and the photoresist affinity group is greater than an affinity between the photoresist layer and the second end group of the polarity switchable group.

13. The method of claim 8, wherein the depositing of the photoresist layer comprises depositing the photoresist layer directly on the bottom anti-reflection layer.

14. The method of claim 8, further comprising:
before the depositing of the photoresist layer, curing the bottom anti-reflection layer.

15. The method of claim 14, wherein the curing comprises baking the deposited bottom anti-reflection layer to activate the cross-linkable group for bonding to another polymer backbone.

16. The method of claim 8, wherein the photoresist layer is an organometallic photoresist comprising a metal selected from a group consisting of tin, palladium, zirconium, cobalt, nickel, chromium, iron, rhodium, and ruthenium.

17. A method, comprising:
providing a substrate;
depositing a bottom anti-reflection layer over the substrate, wherein the bottom anti-reflection layer comprises:
  a polymer backbone,
  a polarity switchable group bonded directly to the polymer backbone,
  a cross-linkable group bonded directly to the polymer backbone,
  a photoresist affinity group bonded directly to the polymer backbone, and
  a photoacid generator;
curing the bottom anti-reflection layer;
after the curing of the bottom anti-reflection layer, depositing a photoresist layer over the bottom anti-reflection layer;
curing the photoresist layer;
exposing a portion of the photoresist layer and a portion of the bottom anti-reflection layer to an extreme UV (EUV) radiation source according to a pattern;
after the exposing, baking the photoresist layer and bottom anti-reflection layer; and
developing the exposed portion of the photoresist layer to transfer the pattern to the photoresist layer,
wherein the polarity switchable group comprises an acid labile group and the acid labile group comprises a carboxyl bond,
wherein the photoresist affinity group consists essentially of —I, —Br, —Cl, —$NH_2$, —SH, —$N_3$, —S(=O)—, imine, aldehyde, amide, and sulfone.

18. The method of claim 17, wherein the curing of the photoresist layer comprises baking the photoresist layer.

19. The method of claim 17, wherein the polarity switchable group further comprises:
a first end group bonded to the polymer backbone; and
a second end group comprising fluorine,
wherein the acid labile group is bonded between the first end group and the second end group.

20. The method of claim 19,
wherein the photoresist affinity group comprises between 1 and 30 carbon atoms,
wherein an affinity between the photoresist layer and the photoresist affinity group is greater than an affinity between the photoresist layer and the second end group of the polarity switchable group.

* * * * *